(12) United States Patent
Vais et al.

(10) Patent No.: US 9,385,247 B2
(45) Date of Patent: Jul. 5, 2016

(54) PASSIVATION SCHEME FOR SOLAR CELLS

(71) Applicant: NewSouth Innovations Pty Limited, UNSW Sydney (AU)

(72) Inventors: Valantis Vais, Beverly Park (AU); Alison Joan Lennon, Rozelle (AU); Stuart Ross Wenham, Cronulla (AU); Jing Jia Ji, Shanghai (CN); Alison Maree Wenham, Cronulla (AU); Jingnan Tong, Maroubra (AU); Xi Wang, Kingsford (AU)

(73) Assignee: NEWSOUTH INNOVATIONS PTY LIMITED, Sydney, NSW (AU)

( * ) Notice: Subject to any disclaimer, the term of this patent is extended or adjusted under 35 U.S.C. 154(b) by 0 days.

(21) Appl. No.: 14/286,665

(22) Filed: May 23, 2014

(65) Prior Publication Data

US 2014/0251817 A1    Sep. 11, 2014

Related U.S. Application Data

(63) Continuation-in-part of application No. 14/357,165, filed as application No. PCT/AU2012/001394 on Nov. 12, 2012, now Pat. No. 9,269,851.

(30) Foreign Application Priority Data

Nov. 15, 2011    (AU) ................. 2011904765

(51) Int. Cl.
*H01L 31/0216*    (2014.01)
*H01L 21/02*    (2006.01)
*H01L 31/0224*    (2006.01)
*H01L 31/18*    (2006.01)

(52) U.S. Cl.
CPC .... *H01L 31/02167* (2013.01); *H01L 21/02258* (2013.01); *H01L 31/022425* (2013.01); *H01L 31/022458* (2013.01); *H01L 31/1868* (2013.01); *Y02E 10/50* (2013.01); *Y02P 70/521* (2015.11)

(58) Field of Classification Search
CPC ................... H01L 21/02258; H01L 31/02167; H01L 31/1868
See application file for complete search history.

(56) References Cited

U.S. PATENT DOCUMENTS

| 2,694,040 | A | 11/1954 | Davis et al. |
| 4,825,997 | A | 5/1989 | Bowman et al. |
| 5,147,827 | A * | 9/1992 | Chino et al. ................. 438/767 |
| 2010/0307540 | A1 | 12/2010 | Ji et al. |
| 2011/0244626 | A1 | 10/2011 | Huang et al. |
| 2012/0024371 | A1 * | 2/2012 | Funakoshi .......... C23C 18/1608 136/256 |

FOREIGN PATENT DOCUMENTS

JP    2011-294312    10/2001

OTHER PUBLICATIONS

PCT International Search Report and Written Opinion, PCT/AU2012/001394, Australia Patent Office, Jan. 2013, 15 pages.
P.H. Lu et al., "Anodic Aluminum Oxide Passivation for Silicon Solar Cells", IEEE Journal of Photovoltaics, vol. 3, No. 1, Jan. 2013, pp. 143-151.

* cited by examiner

*Primary Examiner* — Bac Au
*Assistant Examiner* — Toniae Thomas

(57) ABSTRACT

A method of forming an oxide layer on an exposed surface of a semiconductor device which contains a p-n junction is disclosed, the method comprising: immersing the exposed surface of the semiconductor device in an electrolyte; producing an electric field in the semiconductor device such that the p-n junction is forward-biased and the exposed surface is anodic; and electrochemically oxidizing the exposed surface to form an oxide layer.

24 Claims, 20 Drawing Sheets

PASSIVATION SCHEME FOR SOLAR CELLS

CROSS REFERENCE TO RELATED APPLICATIONS

This application is a continuation-in-part of U.S. patent application Ser. No. 14/357,165 filed May 8, 2014, for Metal Contact Scheme for Solar Cells, which was the National Stage of International Application No. PCT/AU2012/001394 filed Nov. 12, 2012, for Metal Contact Scheme for Solar Cells, which claims priority from Australian Patent Application No. 2011904765 filed Nov. 15, 2011, for Metal Contact Scheme for Solar Cells, the contents of all of which are incorporated herein by reference in their entireties.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD OF THE INVENTION

The present invention relates generally to the field of device fabrication and, in particular, to the formation of metal contacts, and to the formation of passivating layers, for semiconductor devices, such as solar cells.

BACKGROUND OF THE INVENTION

Silicon solar cells require metal electrodes to be formed to each of the p-type and n-type semiconductor material of the solar cell to allow light-generated charge carriers to be extracted and flow in external electrical wires as electricity. Most silicon solar cells have one polarity of electrode on the top (illuminated) surface and the opposite polarity metal contact on the rear surface. In general, most silicon solar cells use different metals for the two cell surfaces because of the differing functions of the different polarity surfaces. For illuminated surfaces, shading losses, metal conductivity and contact resistance to the semiconductor are particularly important, whereas a higher metal coverage and lower conductivity can be tolerated on non-illuminated surfaces. In screen-printed silicon solar cells screen-printed silver is typically used to contact the illuminated n-type front surface and screen-printed aluminium is typically used to contact the p-type rear surface.

Metal electrodes can be formed to solar cells via various metal plating processes. Metal plating is the electrochemical deposition of metal from a solution of metal ions. Deposition can be achieved using an electroless process in which a reducing agent is added to the solution of metal ions to provide a source of electrons at the silicon surface for the metal reduction process. Alternatively, the source of electrons can be the light-induced current of a solar cell in light-induced plating (LIP) or provided by an applied electrical potential in an electroplating process. Electroless plating has been used to form nickel/copper metal electrodes to heavily-doped n-type and heavily-doped p-type grooves in silicon solar cells. Electroless plating has been used commercially by BP Solar in the manufacture of their laser buried grid silicon solar cells. More recently, LIP has been successfully used to metallise a range of silicon solar cells including laser-doped selective-emitter (LDSE) cells. In LIP, the n-type silicon is typically exposed at the base of grooves formed in a front-surface dielectric layer. The LIP process typically requires that the rear surface of the cell either acts as the anode or is physically contacted to an anode. The anode is then oxidised to maintain the source of metal ions for the plating process.

For cells that have a rear aluminium electrode, LIP is an attractive process because the process can be either contactless (as described by Lawrence Durkee in U.S. Pat. No. 4,144,139 "Method of Plating by Means of Light"), or if physical contact is used, then the cell contacting requirements are relatively straightforward because the electrical contact can be made anywhere on the rear aluminium surface (i.e., alignment is not critical). Once physical low-resistance contact has been made to the rear electrode of the cell, then an applied bias can be used to: (i) cathodically protect the aluminium electrode from oxidizing; and (ii) bias the solar cell to operate closer to its maximum (short circuit) current.

Since LIP uses the light-induced current generated by the solar cell to reduce the metal ions to form metal contacts, it can only be used to metallise n-type regions of solar cells. It cannot be used to metallise the p-type regions of cells fabricated on n-type wafers or the p-type regions of bifacial cells. In these cases, exposing the cell to light makes the exposed p-type silicon anodic and hence there is no source of electrons for metal reduction. If low-cost nickel/copper metal plating is to be used for these types of solar cells, then currently either electroless plating or electroplating must be used. Electroless plating has been demonstrated to be undesirable in silicon solar cell manufacturing because of the long plating times required and the expense of maintaining the plating baths and disposing of waste electrolyte. Although electroplating can use much simpler chemistry, because reducing agents are not required in the solution, physical low-resistance contact must be formed to the heavily-doped regions to be plated. This can require precise alignment, especially if the doped regions have been patterned very finely to reduce front surface shading losses. Furthermore, the regions have to be sufficiently conductive for uniform plating over the entire metallisation (i.e., grid) pattern. This typically necessitates a seed layer metal being formed in the regions to be metallised by some other process such as evaporation, sputtering or printing. This complicates the metallisation process.

A key step in the manufacture of silicon solar cells, which can directly result in higher efficiencies by way of increased open circuit voltages, is the passivation of the surfaces of silicon wafers. The passivation processes that currently dominate industrial silicon solar cell passivation include plasma-enhanced chemical vapour deposition (PECVD) for silicon nitride ($SiN_x$) and aluminium oxide ($AlO_x$), thermal oxidation for silicon dioxide ($SiO_2$) and atomic layer deposition (ALD) of AlOx.

Anodic oxide passivation has been suggested as an alternative way for forming oxide layers which can be effectively patterned due to their porosity.

Any discussion of documents, acts, materials, devices, articles or the like which has been included in the present specification is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

In one aspect, the present invention provides a method of depositing metal on an exposed surface of a p-type semiconductor region of a semiconductor device comprising a p-n junction, the method comprising:

immersing the exposed surface of the p-type semiconductor region on which the metal is to be deposited in a solution of metal ions;

producing an electric field in the semiconductor device such that the p-n junction is forward biased;

electrochemically depositing the metal on the exposed surface of the p-type semiconductor region of the semiconductor device by reduction of metal ions in the solution.

The electric field may be produced by placing at least one electrode which does not physically contact the semiconductor device in the solution of metal ions.

In some embodiments of the invention an n-type semiconductor region of the semiconductor device may be isolated from the solution of metal ions.

A second electrode may be employed comprising a material that can electrically contact the n-type semiconductor region of the semiconductor device and the electric field may be produced in the semiconductor device by contacting the n-type semiconductor region of the semiconductor device with the second electrode and producing an electric potential between the at least one electrode in the solution of metal ions and the second electrode contacting the n-type semiconductor region. The material of the second electrode may comprise a conductive compressible interface material. The material of the second electrode may be a conductive carbon-based material and may comprise graphite. The material of the second electrode may have a conductivity within the range of 300 to 1400 S/cm.

The semiconductor device may be transported through the solution of metal ions and the material of the second electrode comprises a surface of a roller or a surface of a rotatable looped belt contacting the n-type semiconductor region of the semiconductor device.

The rotatable looped belt may travel between two rollers located at its extremities and may be supported between the two rollers by intermediate rollers, inflated balloons, which apply the pressure on the semiconductor device via the looped belt.

The semiconductor device is held against the looped belt by a vacuum.

Air jets may be located between the two rollers located at the extremities of the rotatable looped belt to apply the pressure on the semiconductor device via the looped belt.

The conductive fluid may be applied to the surface of the n-type semiconductor region of the semiconductor device contacted by the second electrode. The conductive fluid may be a conductive paste or ink.

In some embodiments of the invention an n-type semiconductor region of the semiconductor device may be immersed into the solution of metal ions, in which case a second electrode may be located in the solution of metal ions to electrically connect to the n-type semiconductor region of the semiconductor device via the solution of metal ions. The electric field may be produced in the semiconductor device by connecting the n-type semiconductor region of the semiconductor device with the second electrode via the solution of metal ions and producing an electric potential between the at least one electrode in the solution of metal ions and the second electrode connected to the n-type semiconductor region.

The n-type and p-type semiconductor material may be at least partially electrically isolated by a barrier within the solution of metal ions.

An electrode may be formed to contact the n-type semiconductor region before the semiconductor device is immersed in the solution of metal ions.

Alternatively where no electrode is formed and the n-type semiconductor region of the semiconductor device is exposed to the solution of metal ions, an oxide may form over surfaces of the n-type semiconductor region exposed to the solution of metal ions and electrical connection to the n-type semiconductor region from the second electrode may be through the oxide layer to the n-type semiconductor region.

An oxide layer comprising a porous anodic oxide may also be formed over exposed surfaces of the n-type semiconductor region by:

i) forming a layer of metal on at least part of the n-type surface prior to its immersion in the solution of metal ions, the solution of metal ions comprising an acid; and ii) anodizing the metal layer during immersion of the n-type semiconductor region in the solution of metal ions, to form the porous anodic oxide.

Electrical connection to the n-type semiconductor region from the second electrode may be via the porous anodic oxide formed on the n-type semiconductor region. The porous anodic oxide may be an anodic aluminium oxide (AAO).

A tunnel oxide layer may be formed over the part of the n-type semiconductor region on which the porous anodic oxide is to be formed and the metal to be anodised is then formed directly over the tunnel oxide layer. The thin tunnel oxide layer may be 2-15 nm thick and preferably 5-10 nm thick. Alternatively the metal to be anodised may be formed directly over the part of the n-type semiconductor region on which the porous anodic oxide is to be formed.

The connection to the n-type semiconductor region over the surface of which the oxide layer has formed may be by an electron tunneling mechanism through either type of oxide formed over the n-type semiconductor region. Alternatively, the electric potential between the at least one electrode in the solution of metal ions and the second electrode connected to the n-type semiconductor region may comprise a pulsed or AC component and the connection of the solution of metal ions to the n-type semiconductor region will be by capacitive coupling between the solution of metal ions and the n-type semiconductor region.

Both in the case when the n-type region is immersed in the solution of metal ions and in the case where it is not, the n-type semiconductor region may be covered by a dielectric layer and the electrical contact to the n-type semiconductor region may occur through one or more openings in the dielectric layer to expose the underlying n-type semiconductor region. The n-type semiconductor region may be heavily doped at least in areas of the n-type semiconductor region exposed through the one or more openings in the dielectric layer. The openings exposing the n-type semiconductor region through the dielectric layer covering the n-type semiconductor region may comprise openings formed by laser scribing or by patterned etching. When laser scribing is employed to form openings in the dielectric layer covering the n-type semiconductor region, the laser scribing may be performed in the presence of an n-type dopant source whereby, during the operation of scribing the dielectric layer covering the n-type semiconductor region, the areas of the n-type semiconductor region exposed through the one or more openings made by laser scribing become more heavily doped than the remainder of the n-type semiconductor region. Alternatively if openings in the dielectric layer covering the n-type semiconductor region are formed by patterned etching, the n-type semiconductor region exposed through the one or more openings made by pattern etching may be made more heavily doped than the remainder of the n-type semiconductor region by a subsequent n-type doping step such as by diffusion.

The entire n-type semiconductor region of the semiconductor device may also heavily-doped.

The method may also include the further step of forming metal contacts to contact the n-type semiconductor region of the semiconductor. The metal contacts to contact the n-type semiconductor region may be formed by immersing the n-type semiconductor region in the solution of metal ions to expose at least a part of a surface of the n-type semiconductor region to the solution of metal ions and illuminating the semiconductor device such that a light-induced current is produced in the semiconductor device which results in metal reduction at the part of the surface of the n-type semiconductor region exposed to the solution of metal ions.

The p-type semiconductor region may be covered by a dielectric layer and one or more areas of the p-type semiconductor region may be exposed through the openings in the dielectric layer. The openings in the dielectric layer covering the p-type semiconductor region may be formed by laser scribing or may be formed by patterned etching. When laser scribing is employed to form the openings in the dielectric layer covering the p-type semiconductor region, the laser scribing may be performed in the presence of a p-type dopant source whereby, during the operation of scribing the dielectric layer covering the p-type semiconductor region, the areas of the p-type semiconductor region exposed through the one or more openings become more heavily doped than the remainder of the p-type semiconductor region. Alternatively if the openings in the dielectric layer covering the p-type semiconductor region are formed by patterned etching, the p-type semiconductor region exposed through the one or more openings may be made more heavily doped than the remainder of the p-type semiconductor region by a subsequent p-type doping step such as by diffusion.

The semiconductor device preferably comprises silicon semiconductor material.

The solution preferably contains ions of one or more of nickel, copper, silver, and tin.

In accordance with discussions above, in one aspect the present invention provides a method of forming an oxide layer on an exposed surface of a semiconductor device which contains a p-n junction, the method comprising;

(i) immersing the exposed surface of the semiconductor device in an electrolyte;
(ii) producing an electric field in the semiconductor device such that the p-n junction is forward-biased and the exposed surface is anodic; and
(iii) electrochemically oxidising the exposed surface to form an oxide layer.

The exposed surface may comprise a surface on the n-type semiconductor region of the semiconductor device.

The semiconductor device may comprise a metal layer (or other anodisable material layer) formed over the n-type region of the semiconductor device and the exposed surface may comprise a surface of that layer. The exposed surface may be doped to a level that ensures ohmic electrical contact between the surface and the electrolyte. The semiconductor device may comprise a tunnel oxide layer between the n-type semiconductor layer and the metal layer. The oxide layer may have a thickness of between 2-15 nm or between 5-10 nm, for example. The metal layer may comprise one of aluminium, titanium, zinc, magnesium, niobium, tantalum and alloys of these metals, or otherwise.

Alternatively, the exposed surface may be a silicon surface of the n-type semiconductor region of the semiconductor device.

The electrolyte may be acidic. For example, the electrolyte may comprise one of sulphuric acid, nitric acid, boric acid, oxalic acid, phosphoric acid, and combinations of these acids, or otherwise The formed oxide layer may be porous.

The electric field may be produced by applying a positive potential to a p-type semiconductor surface of the semiconductor device. A rate of formation of the oxide layer may be controlled by the magnitude of the applied positive potential. The positive potential may be applied using a power source operating under constant voltage or constant current mode. The electric field may be produced by an electrode placed in contact with either one of the p-type semiconductor surface and a thin interfacial oxide layer formed on the p-type semiconductor surface. The positive potential may be applied to the p-type semiconductor surface through a plurality of openings in a dielectric layer formed on the p-type surface. The openings may be formed by one of laser processing and chemical etching.

The semiconductor device may comprise a dopant concentration such that a Schottky diode forms at a surface of the device. The method may comprise illuminating the device to generate a photocurrent at the surface where the Schottky diode forms. A rate of formation of the oxide layer may be controlled by the illumination intensity.

BRIEF DESCRIPTION OF THE DRAWINGS

Embodiments of a metallisation method of field induced plating (FIP), and embodiments of a passivation method using field induced anodisation (FIA), will now be described, by way of example, with reference to the accompanying drawings in which.

DETAILED DESCRIPTION

Figure 1:
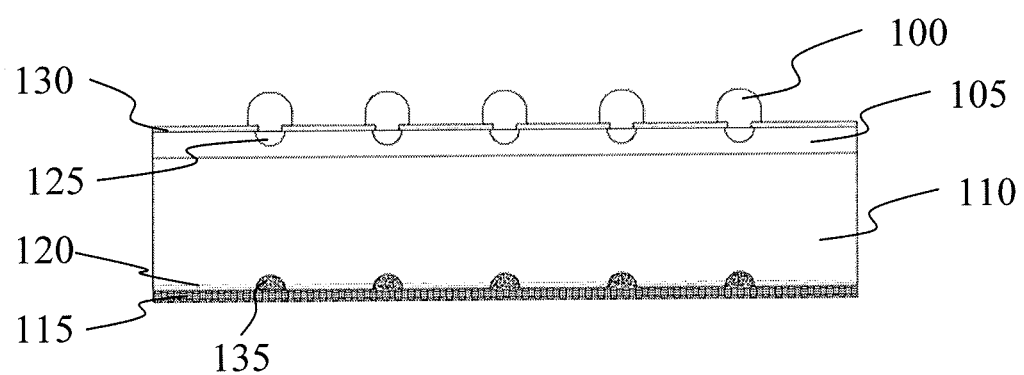
FIG. 1 is a diagrammatic illustration of a solar cell device with an n-type wafer and front p-type junction metallised using field induced metal plating.

A method for forming plated metal contacts on p-type semiconductor surfaces for various solar cell structures is described below. The method does not require any precise alignment and can be performed with minimal physical contact to the solar cell wafer. Furthermore, the plating chemistry complexity is comparable to LIP and electroplating in that the electrolyte does not need to contain reducing agent(s) that must be maintained within operable limits for reproducible plating results. Consequently bath life can be extended resulting in significant reduced cost for manufacturing environments.

The method operates by forward biasing the diode of a semiconductor device (e.g., solar cell) in the dark using an electric field that is induced over the immersed cell by the appropriate placement of electrodes in the bath. The method, which will hereinafter be referred to as field-induced plating (FIP), is very similar to LIP but because the dark solar cell (recombination) current flows in the opposite direction to the light-induced current the p-type surfaces become cathodic and hence are able to be metal plated. The plating process is controlled by: (i) adjusting the current and voltage applied to the electrodes responsible for inducing the electric field over the cell; and (ii) adjusting the chemical composition of the bath (e.g., the conductivity). The LIP process is dependent on the solar cell properties and thus the plating is limited by the open circuit voltage of the device. Since the FIP process depends in the diode characteristics it is not limited by the solar cell's electrical properties and therefore much faster plating rates are theoretically possible.

A key aspect to this metal plating process is the management of the anodic reaction, as current must pass out of the anodic (n-type) regions of the device (solar cell) in order to complete the electrochemical circuit. This is analogous to the anodic reaction of LIP and electroplating. The anodic reaction employed in the arrangements described below varies depending on the process to be performed for the n-type surface. The different arrangements in which this method can be used are described below.

1. Metal Plating of p-Type Contact Regions for n-Type Cells

Currently most manufactured silicon solar cells are produced using p-type wafers. A phosphorus diffusion is performed to form a p-n junction, with the resulting n-type emitter being located at the front (illuminated) surface of the cell. A silicon nitride layer is deposited over this surface using plasma enhanced chemical vapor deposition (PECVD) to form an antireflection coating (ARC) for the cell. Aluminium paste is then screen-printed over the rear p-type surface of the cell, a silver grid pattern is screen-printed onto the front surface and the wafer is fired in an inline furnace at temperatures of ~800° C. Although this manufacturing process is mature and used extensively world-wide, new technologies that reduce the need to use silver are now entering commercial production.

One new cell design is the laser-doped selective-emitter (LDSE) cell. The first few steps for fabricating an LDSE cell are similar to those used for a standard screen-printed solar cell. However, instead of screen-printing a front grid pattern using silver paste, in an LDSE cell a source of phosphorus atoms (e.g., phosphoric acid) is spin-coated over the silicon nitride surface and then a laser is used to form the front grid pattern by simultaneously ablating the silicon nitride layer and incorporating phosphorus dopant atoms into the underlying silicon. If a more lightly-doped emitter is formed initially over the front surface (e.g., 100-120 Ohm/sq), then laser-doping can achieve a selective emitter cell structure where the emitter is more heavily-doped in the grooves where metal is to contact. Selective-emitter cell designs have the advantage that the contact resistance between the silicon and metal is reduced by the heavy-doping in the location of the laser-doped grooves (or fingers) but the remaining surface is lightly-doped to maximise the collection of light-generated carriers from the cell.

Currently, most LDSE cells are fabricated using p-type wafers having an n-type emitter. Metals such as nickel and copper can then be plated to the laser-doped n+ groove regions using LIP because these regions become cathodic when the cell is illuminated. Alternatively electroless plating can be used to metallise the laser-doped regions. However, there is growing interest in using n-type wafers instead of p-type wafers for these solar cells. The commonly-used p-type wafers are typically doped with boron and when silicon crystals are grown using the Czochralski process, oxygen from the crucible can contaminate the growing crystal. The presence of both boron and oxygen can result in B—O defects, that can occur on exposure to light, resulting in reductions in efficiency in the field for cells fabricated on p-type wafers. Use of n-type wafers can therefore potentially result in higher efficiencies in the field because n-type wafers do not incur these efficiency losses.

Laser-doped selective-emitter cells can also be fabricated on n-type wafers, with the laser-doping in this case being formed through a boron spin-on dopant source to form heavily-doped p+ regions in a boron-diffused emitter. The ARC dielectric can be formed using either silicon nitride or a dielectric material, such as aluminium oxide which is deposited by either atomic layer deposition (ALD) or PECVD. If the latter dielectric material is used, then the aluminium atoms in the dielectric layer can either contribute or simply provide the source of dopant atoms for the laser-doping process.

The lightly-doped p-type emitter can be formed either by a furnace diffusion process using boron sources such as boron tribromide or using ion implantation methods. The latter approach can also be used to form a selective-emitter structure because boron ions can be implanted deeper at the locations requiring subsequent metallisation, however clearly openings must then be formed through the subsequently formed dielectric layer to align with the heavily-doped p+ regions of the emitter.

The rear surface for n-type laser-doped cells can be formed using several different approaches. One of the more straightforward methods is to deposit a silicon nitride layer over the rear surface of the solar cell, perform n-type laser-doping through that dielectric layer (as described above for p-type laser-doped cells) to achieve local heavily-doped n+ regions which can be subsequently contacted by either evaporating (e-beam or thermal) or sputtering a layer of aluminium over the entire rear surface. Unlike the alloyed aluminium rear contact employed by current screen-printed cells, this rear contact scheme has the benefit of locally contacting the n-type silicon of the cell through openings in the layer passivating the surface. Silicon nitride is well-suited to passivating n-type surfaces and so is the logical dielectric choice for the rear surface.

Alternative methods for contacting the rear n-type surface include screen printing and firing a silver grid pattern on the surface substantially as currently performed for screen printed cells manufactured on p-type wafers. However, unlike the co-firing process used for current screen printed silicon solar cells, the firing process can be optimized just for the formation of silver metal fingers and so consequently a lower firing temperature can be used. If a rear silver metal grid is used then the resulting cell can be used as a bifacial cell, however given the typically lower efficiency that would result from the illumination through the n-type surface when the junction is near the p-type surface, such cells can also be fabricated into single surface modules by employing a rear reflective surface.

Figure 2:
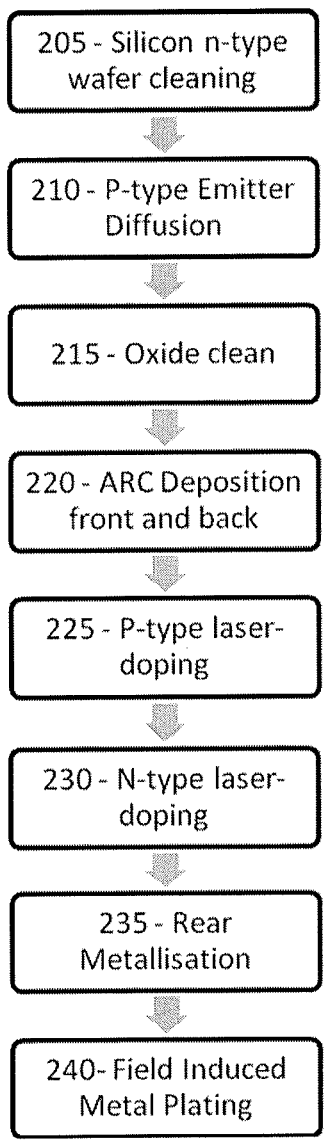
FIG. 2 is a process flow for the fabrication of the device depicted in FIG. 1.

The application of FIP to the metallisation of the p-type laser-doped regions of LDSE cells fabricated on n-type wafers will now be described with reference to FIG. 1 and FIG. 2. FIG. 1 shows the structure of an n-type laser-doped silicon solar cell whilst FIG. 2 depicts the process steps required to fabricate this solar cell. This structure requires the use of an n-type silicon wafer 110. The process begins with the cleaning of the silicon substrate in step 205. This removes any wire sawing damage on the surface of the wafer and removes any metal impurities from the surface. Preferably this step also includes the texturing of the surface to reduce the amount of light that is reflected from the illuminated surface.

Mono-crystalline wafers are typically textured using an alkaline texturing process using aqueous solutions of potassium or sodium hydroxide [3-5% (w/v)] and isopropanol [3-5% (v/v)] that creates randomly-located small pyramids over the surface. An acidic etching solution is more typically used to texture multi-crystalline wafers. Acidic texturing is performed in solutions containing hydrofluoric acid and nitric acid, with the nitric acid being responsible for oxidising the silicon surface and the hydrofluoric acid dissolving the formed oxide. Typically acidic texturing solutions comprise ~45% (w/v) nitric acid and ~15% (w/v) hydrofluoric acid and texturing is performed without a previous saw-damage etch step because the texturing process requires the presence of the saw damage defects for the texturing effect.

In the next step 210, a p-type emitter 105 is formed on the front surface by furnace diffusion of boron to form the p-n junction of the solar cell. During the thermal diffusion process, a boron silicate glass (oxide) forms at the surface of the wafer. The oxide is then removed by a second cleaning step 215. This is preferably performed in a solution of hydrofluoric acid. This cleaning step also prepares both the front and rear surfaces of the cell for the deposition of passivating dielectric layers. Preferably a silicon nitride layer of ~75 nm thickness is deposited over both front and rear wafer surfaces using PECVD in step 220 to form front surface 130 and rear surface 120 dielectric layers. The front surface silicon nitride layer 130 acts as an ARC and helps passivate the front surface of the solar cell and reduce the overall reflection of the surface. Furthermore, it also forms an insulating barrier during the formation of the metal contacts in the FIP step described later. A layer of aluminium oxide, or some combination of aluminium oxide and silicon nitride, can also be used to passivate the p-type surfaces.

A silicon nitride layer formed over the rear surface 120 provides a passivating layer. An advantageous property of silicon nitride layers deposited by PECVD is that they contain stored positive charges which attract electrons in the n-type silicon to the silicon-silicon nitride interface. This results in the formation of an accumulation layer which reduces the surface recombination velocity of the interface. The formed accumulation layer can be viewed as acting like a weak back surface field (BSF) which serves to repel minority carrier holes from the rear surface. Alternative processing sequences can directly form a BSF by diffusing an n-type layer over the entire rear surface.

In step 225 p-type laser-doped regions 125 are formed on the surface of the p-type emitter 105 preferably after spin-coating a layer of a boron doping source, such as provided by companies such as Filmtronics. Alternatively, if aluminium oxide has been used as the front passivating dielectric it can provide a source of aluminium atoms for the p+ laser-doping. Preferably the sheet resistance at the base of the p-type laser-doped regions is at most 50 Ohm/sq. The spacing of the fingers in this front grid pattern can be optimized from a knowledge of the sheet resistance of the p-type emitter layer 105, by balancing the power loss due to the series resistance associated with the lateral current flow in the emitter against the power loss due to shading which increases as fingers are placed closer together.

N-type laser-doped lines 135 or point contacts are then formed at the rear surface of the cell in step 230, substantially using the process described previously for p-type LDSE cells. Point contacts have the advantage of reducing the metal silicon area and thus reducing the saturation current density and increasing the implied open circuit voltage of the final device, however formation of point laser-doped regions typically requires the use of a Q-switched laser or else a mask which is used in conjunction with a continuous wave laser with the latter having issues associated with aligning the mask with the solar cell. Preferably the sheet resistance at the base of the n-type laser-doped regions is at most 20 Ohm/sq and more preferable ≤10 Ohm/sq. The spacing of the rear fingers or the point contacts is such that no more than 10% of the surface area is heavily doped and preferably in the vicinity of 1%. Furthermore, deeper laser-doped regions are desirable in order to achieve a more effective local BSF to repel minority carriers from the high surface recombination velocity metal-silicon surface. Although laser-doping is the preferred way of forming the heavily-doped regions in the cell, other methods of forming openings (e.g., patterned etching) can also be used.

Metal contact is then made to the n-type (rear surface) laser-doped regions in step 235 by sputtering aluminium over the entire rear surface. Preferably the aluminium layer 115 is at least 2 um thick. Alternatively, the rear electrode can be formed by either thermal or e-beam evaporation of aluminium, or screen-printing of aluminium paste. In the variation where screen-printed paste is used a short heat curing process is required to drive out solvents used in the pastes. In this case, if the wafer is heated above 577° C. (the eutectic temperature for aluminium and silicon), the n-type silicon has to be sufficiently heavily doped so that the firing of the aluminium does not lead to the formation of a localised p+ region underneath the aluminium that forms a rectifying junction with the n-type silicon. The rear aluminium layer contacts the silicon in the laser-doped openings to form local contacts. Having the full surface covered with aluminium provides a rear reflector for the cell, an important attribute especially as wafers become thinner and a larger proportion of the longer wavelength light can pass through the cell without absorption. Small amounts of silicon (e.g., <1%) can be added to the aluminium used to form the rear metal layer to minimise the risk of device degradation due to silicon diffusion into the aluminium. Alternatively, stacks of deposited metal can be employed in this rear metal electrode, with barrier layers comprising metals such as nickel, titanium, or tungsten, being used to limit interdiffusion of silicon and aluminium.

In a variation to the abovementioned method of forming rear contacts through the rear silicon nitride layer 120, before the plating process silver paste fingers can be screen-printed and then fired through the silicon nitride layer 120 substantially as described for prior art screen-printed silicon solar cells. Preferably the firing temperature is maintained below 700° C. to avoid damage to the hydrogen passivation provided by the silicon nitride layer. The screen-printed metal grid can then act as the rear metal electrode (i.e., equivalent of 115 in FIG. 1). In this variation, the rear surface of the cell is preferably encapsulated with a reflective backsheet to maximise light trapping in the cell. Alternatively it can be integrated into a bifacial module where light can be captured from both surfaces.

Figure 3A:
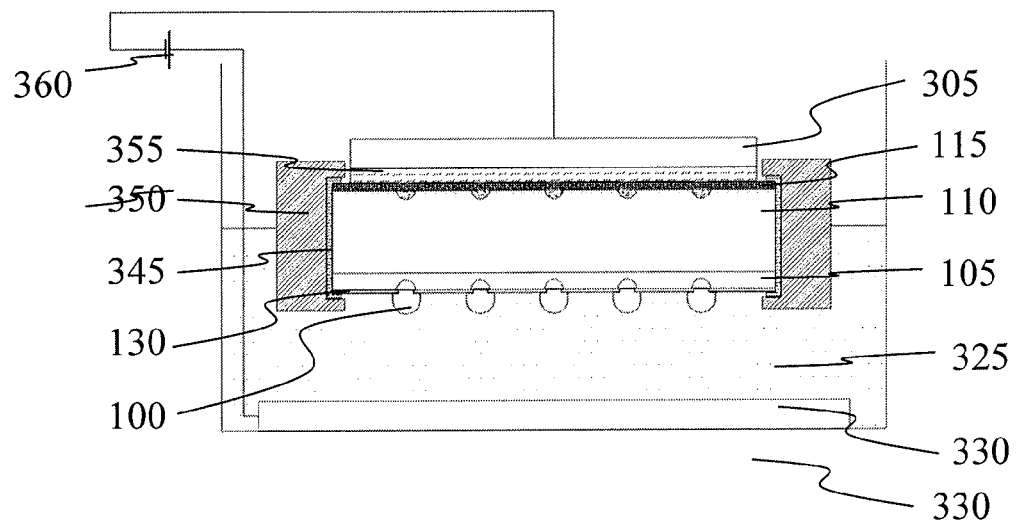
FIG. 3a to FIG. 3f are diagrammatic illustrations of possible alternatives for field inducted plating apparatuses.

The wafer is now prepared for the FIP process which is performed in step 240. The wafer is placed into an apparatus that is used to perform FIP as shown in FIG. 3a. The FIP process results in the formation of plated metal contacts 100 on the p+ laser-doped regions 125 formed in the p-type emitter 105. The apparatus is such that the front surface p-type emitter 105 and the rear aluminium electrode 115 of the solar cell depicted in FIG. 1 are electrically isolated. This can be achieved using a water impermeable material 345 such as nitrile foam allowing for only the front of the surface to be submerged in a plating solution 325 whilst the rear surface 115 remains dry. In addition the impermeable material 345 must avoid non uniform pressures on the wafer to avoid breakage. The impermeable material 345 is preferably in contact with a wafer holder 350 that can move the wafer through a plating bath, with the speed of the wafer holder 350 determining the effective plating time.

The rear metal contact on the solar cell 115 is placed to come in physical contact with a conductive electrode 305. A conductive interface material 355 is placed between the rear electrode of the cell 115 and the conductive electrode 305. This interface material 355 is preferably an expanded graphite material to provide the necessary conductivity without damaging the surface of the wafer. The conductive interface material 355 and the electrode 305 are preferably enclosed within the wafer holder 350. Furthermore the interface material 355 can consist of a stack of other foam materials to control the amount of direct pressure applied to the surface of the wafer.

Preferably the electrically conductive interface material 355 is between 1 and 20 mm thick, and more preferably between 1 and 10 mm thick and has a compressibility between 40% and 80%. Example materials include expanded graphite ribbon tape (such as provided by Yichang Xincheng Graphite Company Limited), flexible graphite foils and laminates (such as provided by SGL Group sold under the product name Sigraflex), conductive polymer plastics such as conductive nylon, polyester urethane, polyether urethane (such as provided by 3M) or conductive viscous electrolyte fluids, inks or pastes (such as provided by Dow Chemicals).

In the case of the graphite-related materials, preferably the interface material 355 has a conductivity of 300 to 1400 S/cm, and more preferably 800 to 1200 S/cm in a plane perpendicular to the axis of the compressibility. Materials having isotropic conductivity properties can also be used provided that they have sufficient compressibility to enable electrical contact to the silicon exposed in the base of grooves formed in a dielectric layer.

The electrode 305 is connected to the negative terminal of a power supply 360 which can be operated in either current-control mode or voltage-control mode. The positive terminal of the power supply is then connected to an electrode 330 (anode) that is submersed in the plating electrolyte 325. Once a voltage is applied to the two electrodes 305 and 330, the electric field between the electrodes induces a forward bias in the diode of the solar cell 110. The forward bias reduces the inbuilt potential of the diode and enables current to flow freely though the junction of the semiconductor device. Electrons are attracted to the p-type regions exposed to the electrolyte 325 through the laser-doped regions 125 of the emitter 105. This concentration of negative charges at the surface of the exposed p-type silicon regions attracts the positively-charged metal ions (e.g., copper, nickel, silver or tin) to the surface where they are reduced to form (plated) metal deposits 100. Metal does not plate on the silicon nitride surface 130 covering the p-type emitter 105 because the silicon nitride provides an insulating barrier.

At the n-type surface, the rear aluminium electrode 115 is in electrical contact with the negative terminal of the power source 360 via the conductive interface material 355 and the electrode 305. Electrons flow into the cell via this connection thus completing the electrochemical circuit. Because the diode is forward biased by the electric field between the electrodes of the power source, once the potential barrier of the p-n junction has been exceeded, current can flow freely through the device with the effective plating current being determined by the applied potential, the bulk resistivity of the silicon wafer, the ohmic resistance of the plating electrolyte, the resistance associated with the interface between the electrode 305 and the aluminium rear surface of the cell 115, and the overpotential at the cathodic surfaces of the solar cell.

Figure 4:
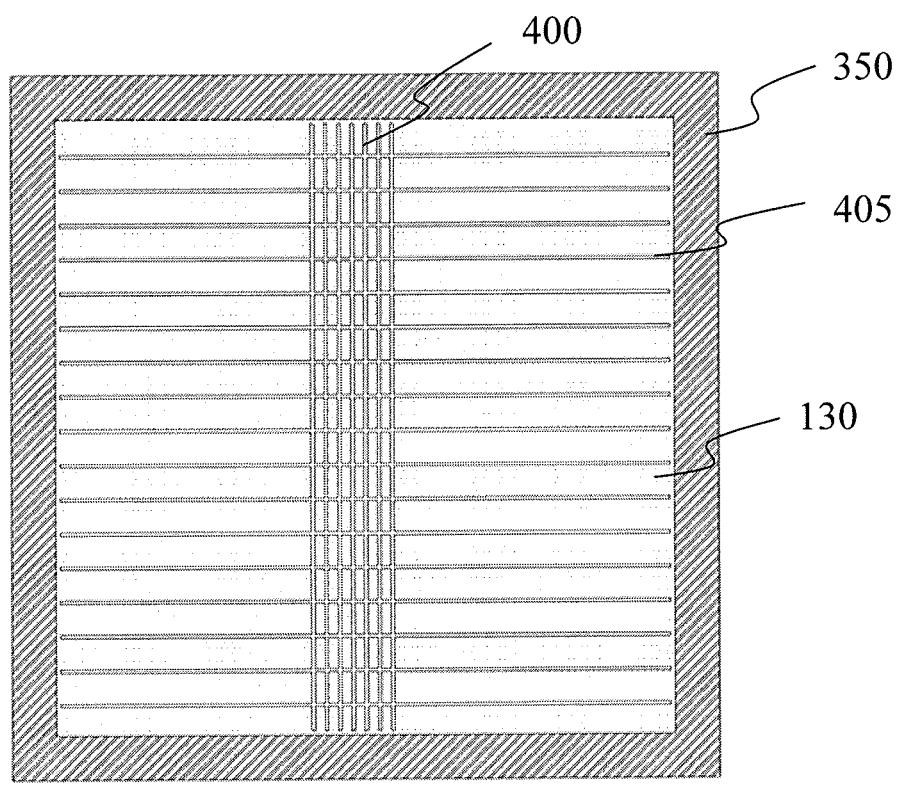
FIG. 4 is a diagrammatic illustration of a view of the solar cell device depicted in FIG. 1 from underneath the device being plated showing the arrangement of metal fingers and a busbar.

A front surface metal grid 400, as shown exposed in a bottom view of the wafer holder 350 in FIG. 4, can be formed using FIP as described above. The grid can consist of very fine fingers 405 formed in the dielectric 130. The fingers can be plated to metal heights (thicknesses) in excess of 10 μm. Preferably, the bulk of the metal finger is plated with a very conductive and inexpensive metal such as copper. Copper metal fingers and busbars ~10 μm thick can be plated in 10 mins using a current of 0.5 A and an applied voltage of 1.5V.

Figure 12:
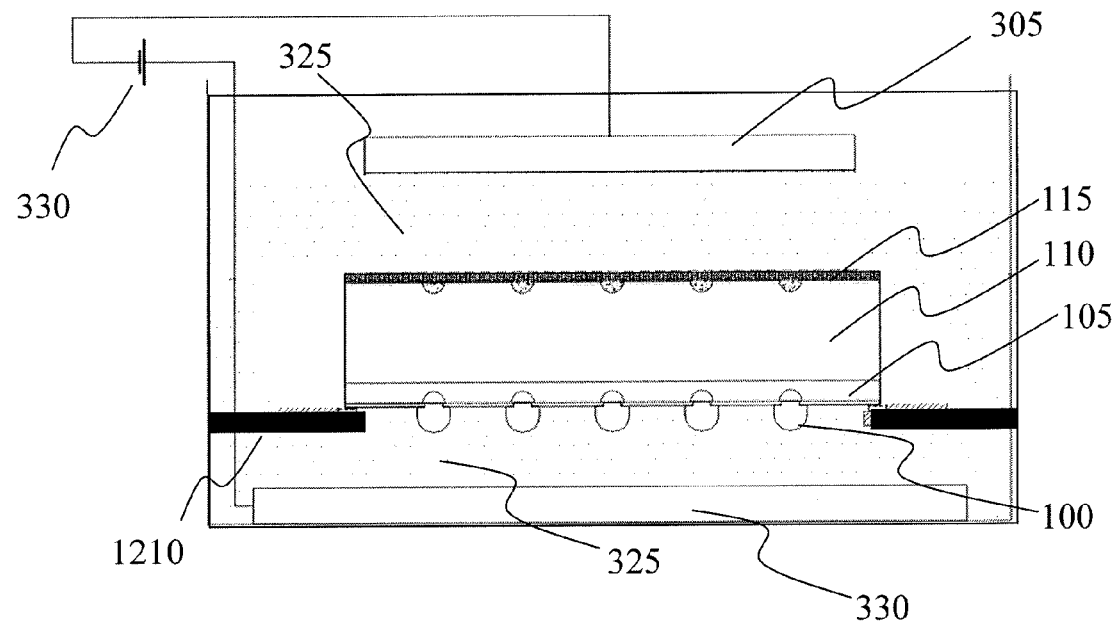
FIG. 12 is a diagrammatic illustrations of an alternative field induced plating apparatus used to metallise the solar cell depicted in FIG. 1.

In a variation to this approach, the apparatus of FIG. 3a can be fully submerged within the electrolyte 325, allowing the conductive interface material 355 to also comprise electrolyte 325 or to be simply replaced by the negative electrode 305 which is fully immersed in the electrolyte 325. In this implementation (which is shown in FIG. 12), electrolyte above the wafer can be constantly exchanged or replenished as necessary from the electrolyte volume 325 below the wafer, both by diffusion where concentration gradients exist and also by flow driven by the electric field applied between the positive electrode 330 and the negative electrode 305. This approach has both advantages and disadvantages. One disadvantage is that leakage current flows between the two electrodes around the edges of the wafer 110 although this can be kept to acceptable levels through control of electrode shapes and locations, conductivity of the electrolyte 325, applied voltage 360, and use of the edge barrier 1210.

If the n-type surface is covered by an metal layer 115 as shown in FIG. 1, then this metal will oxidise to provide a source of electrons to the electron-poor n-type silicon. If the metal is the same as that being used to plate the p-type contacts then this oxidation process provides a way by which the bath can be replenished with metal ions. However if a different metal is used (e.g., aluminium) then the FIP process will ultimately contaminate the electrolyte 325 with aluminium ions. Electrolyte treatment can be performed to remove the contaminating metal with the aluminium ions being precipitated out of the bath using pH control.

Clearly, when the electrolyte 325 is used as the conductive interface material 355, it is preferable to use metals that can oxidise without passivation. Metals like silver which have a very high redox potential (i.e., have a greater propensity to be reduced) require large applied fields for their oxidation and the larger fields can result in dendritic growth of the metal plated 100 on the p-type regions.

The other benefit of using the electrolyte 325 to make electrical contact to the n-type silicon surface or to the metal coating on the n-type surface is that it avoids any physical contact which could otherwise create non-uniformities in plating and potentially damage or even break the wafer through the mechanical force needed to ensure reliable electrical contact.

It is also feasible to use this submerged approach without edge barriers 1210 provided higher leakage current around the edges can be tolerated with its associated reduced plating rate near the edges. The reduced plating rate near the edges, if a problem, can be overcome through using additional negative electrodes (with a separate power supply if necessary to controllably supply any desired edge current by changing the potential of the additional electrodes) near the edges of the wafer to deliberately supply the edge leakage current and effectively bias the edge regions to the same potential as necessary to achieve uniform FIP across the rest of the wafer.

Use of very high plating currents with all forms of FIP can result in dendritic growth which results in fingers and busbars with low conductivity. Plating rate control is more readily achieved using a power source 360 operating under current control, because once the rectifying voltage has been exceeded for the diode the current increases exponentially as a function of voltage and it is consequently difficult to control the plating rate if a voltage-control mode is used.

Preferably, a thin nickel barrier layer (e.g., <0.5 μm thick) is first plated and then sintered to form a nickel silicide. The nickel silicide serves to reduce the contact resistance, improve adhesion and also provide a barrier to the diffusion of copper into the device where it can impact device performance. Alternatively, if sufficiently heavily-doped p+ regions have been formed the plated nickel need not be sintered thus allowing the wafer carrying device to move directly from the nickel plating solution, via a rinsing bath to the copper plating bath.

Figure 3B:
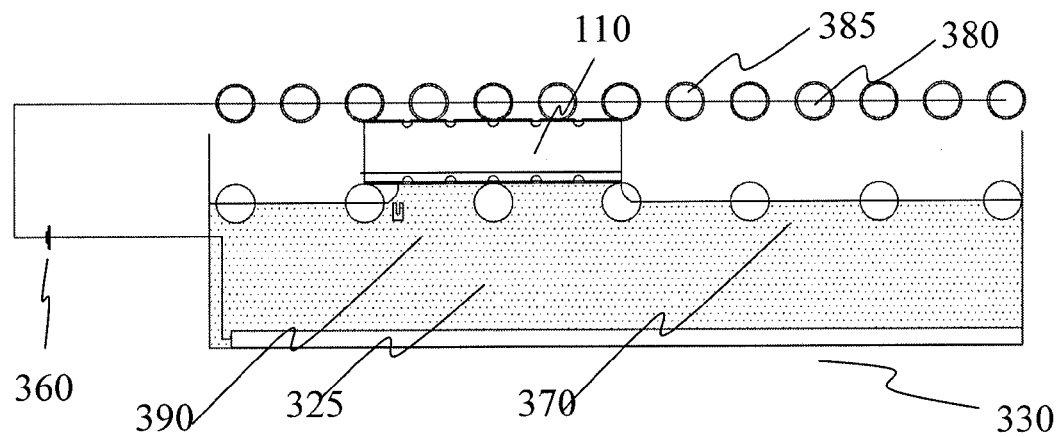

In an alternative FIP arrangement, which is depicted in FIG. 3B, wafers to be plated can be transported through a plating bath supported on a series of rollers 370 and oriented with their p-type emitters facing downwards using a transport mechanism substantially as described in US patent application 2010/0307540. The top (n-type) surface of the wafers 115 is maintained dry whilst the plating electrolyte 325 makes contact with the p-type surface of the wafer via small jets 390 which spray the liquid over the surface in a continuous stream that facilitates electrical contact between the wafer surface and the electrode 330 via electrolyte 325.

Physical low-resistance contact to the n-type surface can be achieved via a further set of rollers 380 that are encased by a conductive mat material 385 comprising essentially the same material as described for the conductive interface material 355 of FIG. 3a. The upper rollers 380 can be formed of foam or other such compressible material to ensure that undue pressure is not applied unevenly to the wafer surface. Alternatively, the upper rollers 380 can be formed in entirety from the conductive mat material 385. Wafers are loaded onto the conveying rollers 370 and are transported through the bath effectively between the two sets of rollers. A series of metal electrodes 330 are placed at the bottom of the bath so at all times the electric field is oriented perpendicular to direction of wafer conveyance.

Figure 3C:
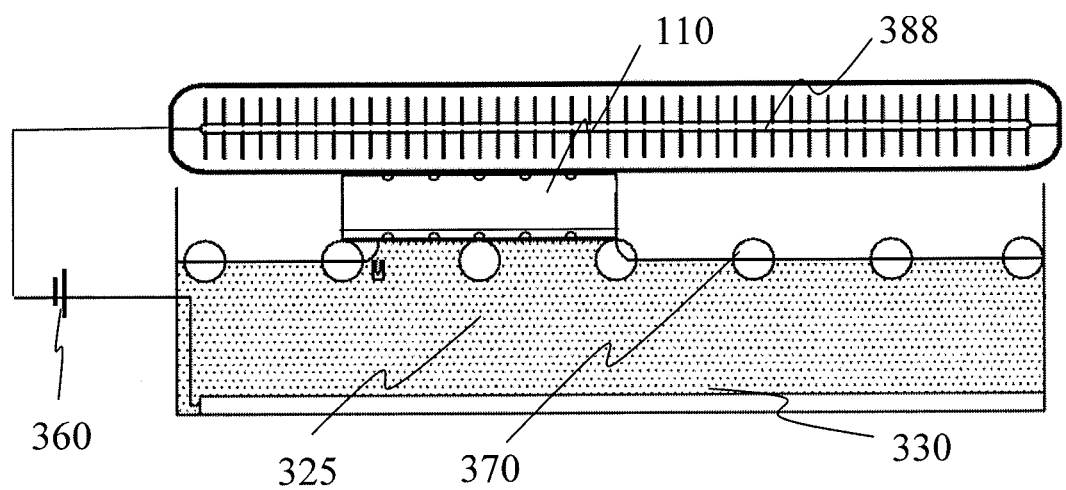
Figure 3D:
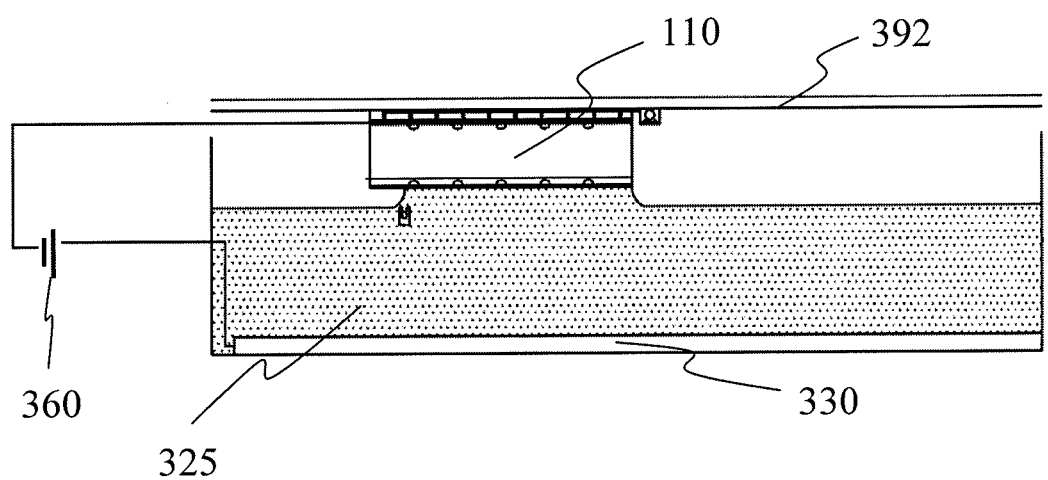
Figure 3E:
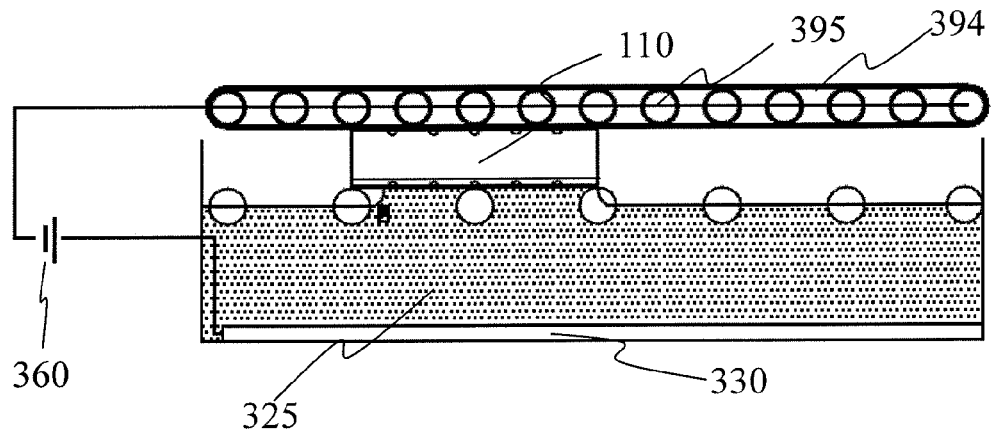
Figure 3F:
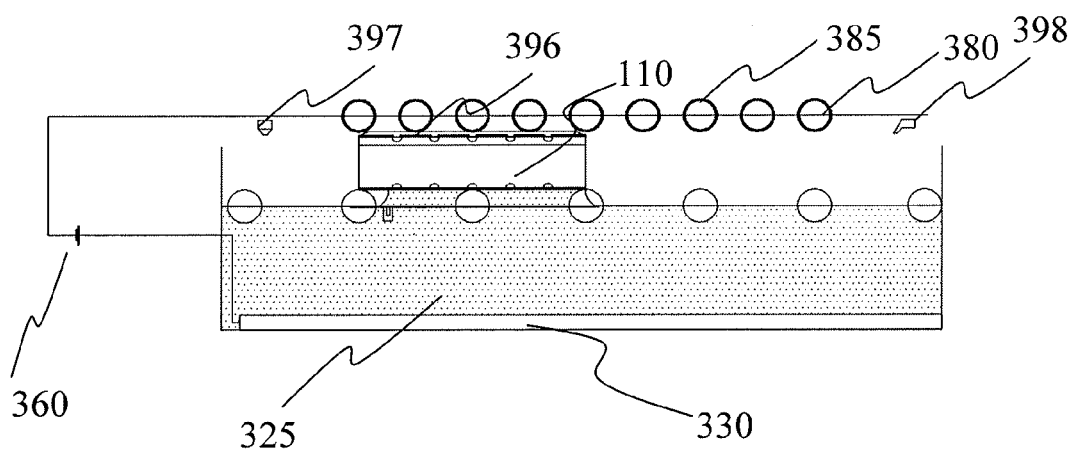

FIG. 3c to FIG. 3e depict further variations of the soft contacting method. In FIG. 3c, a conveyor belt 388 (that is covered with the conductive interface material 355) and rotates on rollers on either end (rollers not shown in FIG. 3c) can be used to contact the n-type surface. Pressure is applied to the middle of the conveyor belt by guided air jets or "air pens" or by having a balloon-like material located over the belt which inflates and provides downward pressure on the surface of the wafer. FIG. 3d depicts a variation in which suction is used to hold the wafer up against a conveying belt 392 that is covered with the conductive interface material 355. As the wafer is held by the provided suction, the bottom rollers 370 in FIG. 3b are not required. FIG. 3e is a variation of the apparatus shown in FIG. 3b, where a long track of carbon mat 394 comprising the conductive interface material 355 is rotated along a series of wheels or rollers 395 similar to tank tracks. The pressure applied by the wheels or rollers 395 are regulated via springs or air springs. This allows for precise control of the pressure applied to the wafer. In the abovementioned arrangements, the conductive interface material 355 enables electrical contact to the n-type semiconductor via either the rear aluminium electrode. FIG. 3f depicts a variation that uses a conductive fluid such as a paste or ink. The fluid 396 is initially sprayed or deposited on the wafer by a delivery system 397. The top conductive roller is similar to those depicted in FIG. 3b using 380 and 385. At the completion of the process the fluid is either extracted using 398 or can simply be cleaned off.

2. Metal Plating of Bifacial Solar Cells

Figure 5:
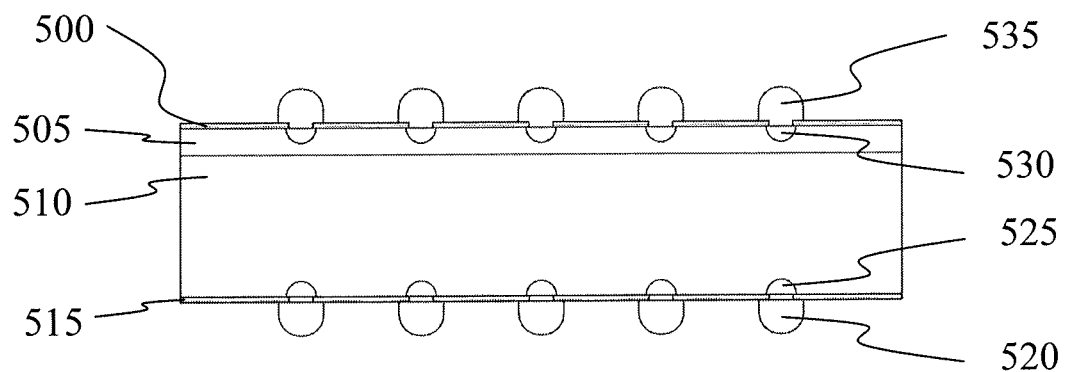
FIG. 5 is a diagrammatic illustration of a bifacial solar cell device metallised using field induced metal plating.

Field-induced plating can also be used in conjunction with LIP to metallise bifacial solar cells, such as depicted in FIG. 5. These cells do not employ a rear aluminium electrode that covers the entire rear surface of the cell. A bifacial silicon solar cell can be fabricated substantially as described for the previous arrangement but in this case the rear aluminium electrode is not required. Instead a metal grid is plated to both the p-type and n-type surfaces of the device. The ARCs 500 and 515 can be formed from the same dielectric material, such as silicon nitride, or different materials can be used for each of the p-type and n-type surfaces.

Figure 7:
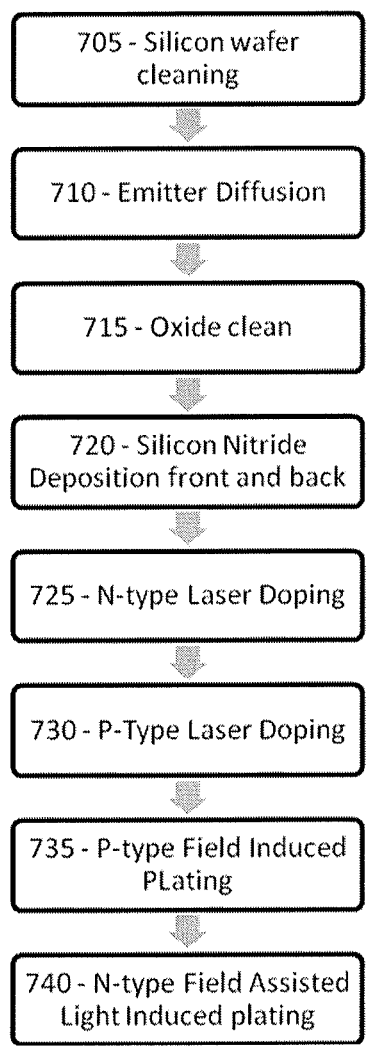
FIG. 7 is a process flow for the fabrication of the device depicted in FIG. 5.

The process flow for fabricating a plated bifacial cell is shown in FIG. 7. These cells can be fabricated on either p-type or n-type wafers, however the preferred arrangement employs a p-type wafer 510 on which a lightly-doped n-type emitter 505 is formed with either a furnace phosphorus diffusion or an ion implantation step. Alternatively, an n-type wafer can be used and a boron emitter can be formed as described for Arrangement 2 above. The latter configuration can have some advantages over use of a p-type wafer and a lightly-doped n-type emitter because p-type surfaces are more difficult to passivate because of the large capture cross-section of the minority carrier electrons in p-type semiconductors. The increased doping of the p-type emitter helps minimise the dark saturation current contribution from the p-type surface.

Similarly to the process flow shown in FIG. 2, step 705 cleans and texturizes the wafer before the emitter diffusion in step 710. During the diffusion an oxide forms on the emitter surface. This surface oxide is then removed during another cleaning step 715. Silicon nitride or aluminium oxide is deposited 720 on the front and back surfaces of the wafer 510 depending on the polarity of the wafer. Grid patterns are then formed by laser doping in steps 725 and 730 to the n-type and p-type surfaces, respectively. Preferably, the heavily-doped grooves 530 and 525 are formed using laser-doping, substantially as described above for first arrangement. This localized laser doping allows for both the front and the rear of the solar cell to be optimized for current collection by using a lightly doped emitter 505.

The metallisation process then proceeds as described for the first arrangement where the p-type grooves are plated using FIP in step 735. During this process, the conductive interface material 355, or conductive electrolyte 325 in the case of full submersion, enables electrical contact directly to the silicon exposed in the n-type laser-doped grooves. There is no need to print or deposit a seed layer of metal into these grooves as is required for electroplating because electrical contact is formed to the entire laser-doped grid pattern via the conductive interface material 355 during FIP.

Figure 6:
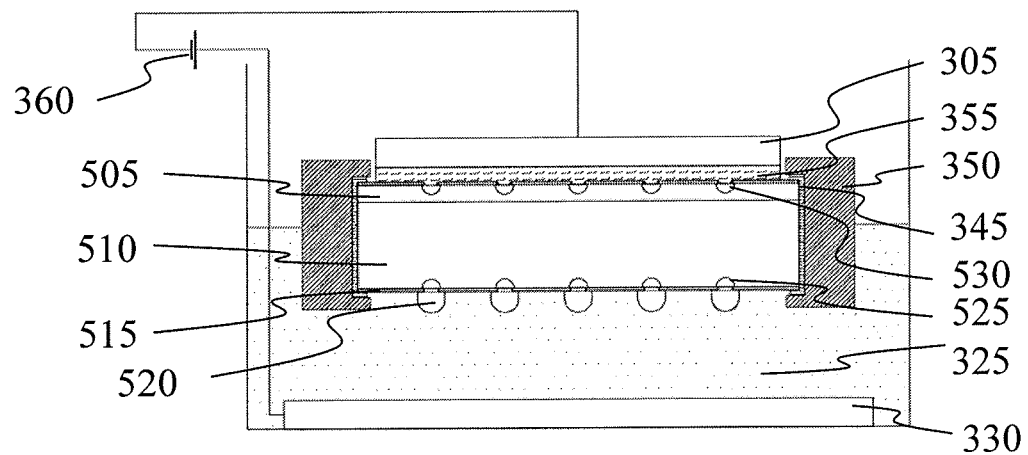
FIG. 6 is a diagrammatic illustration that depicts the plating of metal contacts to p-type laser-doped grooves using a field-induced plating apparatus.

A diagrammatic illustration of the apparatus required to perform step 735 is provided in FIG. 6. FIP is performed in the same apparatus shown in FIG. 3A although other FIP tools, such as shown in FIG. 3B can also be used. The conductive interface material 355 is critical for the FIP process because it enables electrical contact to be made to the very fine laser-doped silicon lines. The fibres from the conductive material can form low-resistance contact to the heavily-doped silicon along the laser-doped lines. This is advantageous over electroplating arrangements where non-uniform metal deposits can result due to the need for current to move along a laser-doped line to contact an electrode.

Once metal has been plated on the laser doped p-type semiconductor lines 525 using FIP, the solar cell is flipped and placed in the same apparatus but this time with its n-type surface facing downward. The n-type surface of the solar cell is now immersed in the solution and is illuminated using light sources placed in the bottom of the bath. This attracts electrons to the n-type surface where they can be accepted by metal ions in the plating electrolyte 325 resulting in the deposition of metal contacts 535 over the n-type laser-doped lines in step 740 of the process flow shown in FIG. 7.

During this LIP process, the metallised p-type surface of the solar cell 510 is electrically connected to the negative terminal of the power supply 360. The conductive interface material 355 electrically contacts the metal fingers 520 formed in the FIP step (i.e., step 735). The power supply 360 has the same polarity in both the LIP and FIP steps with the anodic (corroding) electrode 330 being immersed in the plating electrolyte 325 at the base of the plating bath. The only differences between the FIP and LIP steps are: (i) the wafer orientation within the electric field formed between the electrodes 330 and 305; and (ii) the presence of illumination on the n-type surface during the LIP step. This means that the same tool can be used to perform both processes. The FIP apparatus shown in FIGS. 3a and 3b can modified to perform both the FIP and LIP steps by placement of high intensity lights, such as compact fluorescents or LEDs, in linear arrays between the metal anodes 330. In both processes the electric field is maintained perpendicular to the cell surface to ensure uniform plating across the cell. Note that in the case where semi-transparent electrodes are used such as in a grid formation that allows light transmission, the lights for the LIP can be located further from the wafer surface than the electrode and in the case where a bifacial solar cell structure is being formed, the light can be incident on either surface or even both surfaces of the wafer during LIP.

As mentioned previously for the first arrangement, wafers to be plated can either be moved through the bath constrained in wafer holders (e.g., 350 as depicted in FIG. 3a and FIG. 6) or constrained within two sets of rollers as depicted in FIG. 3b. The use of the roller configuration is preferable for the plating of bifacial cells because the flipping of wafers is more readily achieved by an automated wafer handling process.

Figure 13:
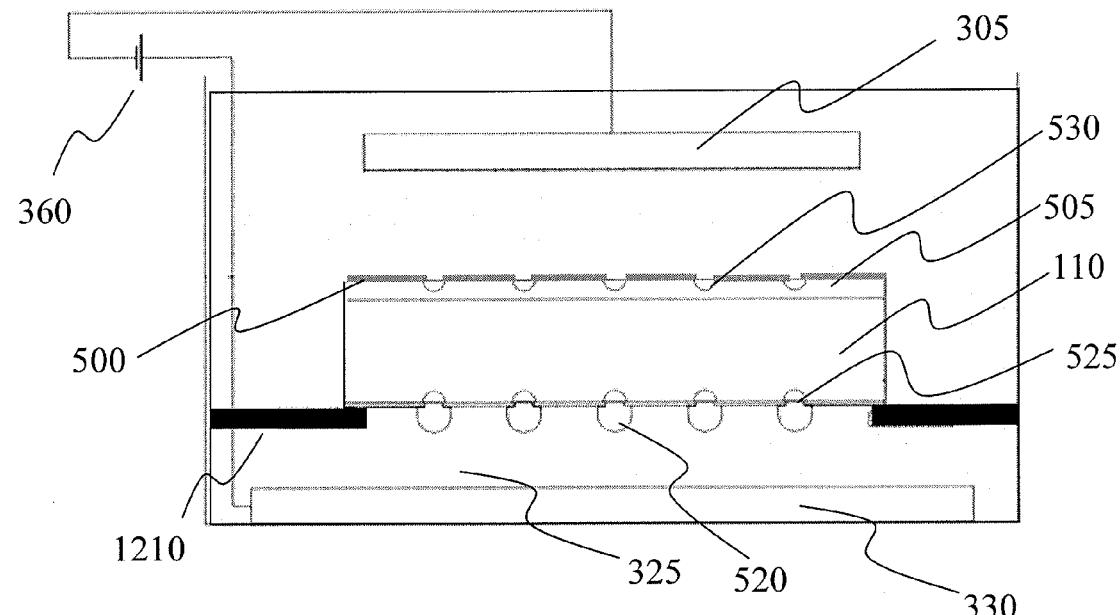
FIG. 13 is a diagrammatic illustration of the alternative field induced plating apparatus shown in FIG. 12 used to metallise the solar cell depicted in FIG. 5.

The immersed arrangement of the FIP process (described above with reference to FIG. 12) can also be used to metallise bifacial cells as shown in FIG. 13. In this case there is no metal between the n-type surface 505 and the electrolyte 325 and the heavily doped n-type silicon regions (grooves) 530 are exposed through openings in the dielectric layer 500. During FIP the electron concentration at the exposed n-type silicon regions 530 will become depleted and the exposed silicon surface of the exposed n-type silicon regions 530 will oxidize (not shown). In aqueous solutions, the presence of holes (or paucity of electrons) at a silicon surface results in the electrochemical reaction of silicon oxidation and water (or more correctly hydrogen ions produced from the dissociation of water) reduction. The result is the formation of silicon dioxide on the exposed surface. Oxygen containing anions in the electrolyte (e.g., sulphate) can also be reduced resulting similarly in the formation of silicon dioxide.

This however can be used to advantage since the electrical resistance introduced by such a silicon dioxide layer dominates over all other resistances within the circuit. Higher voltages provided by the power supply 360, typically in the range 10-40 volts, are therefore necessary, but uniformity of current flow through the device is now determined by the resistance of the silicon dioxide layer rather than shape or placement of the electrodes, or path-length through the electrolyte etc. If, for example, less current flows through the surface of one of the n-type regions 530, then that region would have a thinner silicon dioxide layer with lower corresponding electrical resistance. Consequently, current will preferentially flow through this region until its electrical resistance is similar to other exposed n-type silicon regions 530. Fortuitously, as the silicon dioxide layer increases in thickness for a given supply voltage 360, it eventually becomes near impossible for further oxygen atoms to penetrate through the silicon dioxide layer and so the oxide layer ceases to grow in thickness and current flow through the oxide is dominated by flow of electrons in a similar manner to electrons tunneling through the oxide of an MIS device.

The thin silicon dioxide layer then acts as a capacitor with positive charge building up at the silicon/silicon dioxide interface as plating proceeds on the p-type surface. If this potential increases sufficiently it can drive the oxidation of water ($H_2O \rightarrow \frac{1}{2}O_2(g)+2H^++2e^-$) or other components in the electrolyte (e.g., sulphate ions: $SO_4^{2-} \rightarrow \frac{1}{2}S_2O_8^{2-}+e^-$). The generated electrons can then tunnel through the thin oxide to complete the electrical circuit, while generated oxygen gas (in the case of water oxidation) appears as bubbles which evolve from the openings in the dielectric layer. Alternatively, other anode reactions can be engineered by first ensuring that the exposed n-type silicon surface 530 is activated with a layer of palladium or platinum (not shown) and then using a range of possible reducing agents in the electrolyte (e.g., formic acid) to generate a source of electrons at the interface.

In this variation of FIP, it is important to carefully engineer the anodic reaction. However, once the chemistry of the anodic reaction is defined, then the shape and location of the negative electrode 305 become relatively unimportant since the resistance from the electrode to the wafer surface is no longer of great significance. In fact good FIP has been demonstrated with greatly reduced electrode dimensions for both the negative electrode 305 and the positive electrode 330 such as with the negative electrode 305 located centrally above the wafer and with a width of less than 10% of the width of the wafer (1 cm versus 15 cm respectively).

Another method for effectively enhancing electron flow through the silicon dioxide layer to facilitate FIP while avoiding increased oxidation of the surface of the heavily doped n-type silicon region 530 is to use pulsed or an AC (alternating current) supply superimposed on a DC bias (for the power supply 360) to take advantage of the parallel plate capacitor formed by the silicon dioxide dielectric layer over the surface of the heavily doped n-type silicon region 530 with the electrolyte 325 and the wafer 110 (but specifically the surface of the heavily doped n-type silicon region 530) on either side forming the conductive parallel plates.

The thin silicon dioxide layer formed during FIP can also potentially be used to improve the passivation of the exposed surface of the heavily doped n-type silicon region 530 or even to passivate (oxidize) the silicon under pin-holes in the surface dielectric layer 515 to protect against unwanted plating such as through subsequent or simultaneous LIP or electroless plating.

For the case where the wafers are fully immersed in the electrolyte 325 and the conductive medium 355 (in FIG. 3*a*) is replaced by conductive electrolyte 325, it is possible to mount the light source for LIP on the same side of the wafer as the negative electrode for the FIP process to avoid flipping the wafer. In this implementation, with no physical contact between the electrodes and wafer surfaces, the LIP process (in the absence of power supply 360) effectively transfers some of the metal plated to the p-type regions across to the n-type regions using the solar cell as the power supply and the electrolyte 325 as the conducting medium. For example, for the case where copper 520 has been plated to the p-type regions 525 by FIP, the illuminated solar cell causes copper ions to be released into the electrolyte as the copper atoms give up electrons into the p-type region of the solar cell. These copper ions travel to the surface of the heavily doped n-type silicon region 530 or the metal contacts subsequently forming thereon to complete the circuit where they are reduced by receiving electrons from the surface of the heavily doped n-type silicon region 530, thereby plating copper that has effectively been transferred from the p-type contact 520. In this implementation, a small amount of hydrofluoric acid is often needed within the electrolyte to remove the surface oxide layer to allow the reduction of copper to take place at the surface of the heavily doped n-type silicon region 530.

3. Metal Plating of Interdigitated Rear Contact Solar Cells

Figure 8:
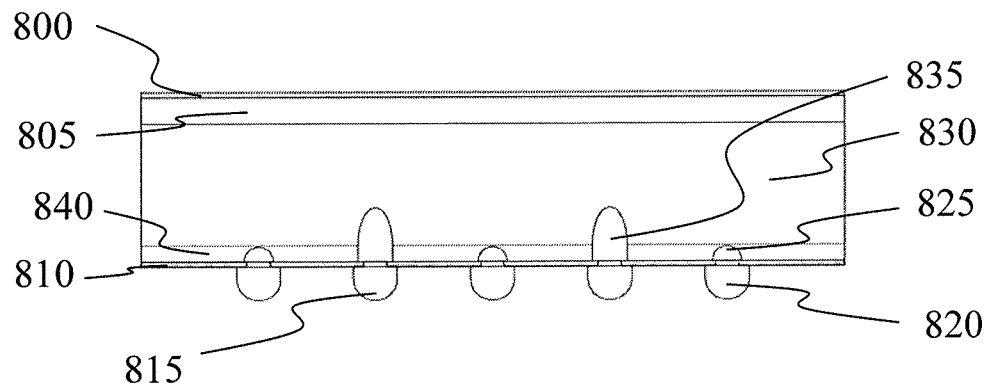
FIG. 8 is a diagrammatic illustration of an interdigitated rear contact solar cell device formed through field induced metal plating.
Figure 9:
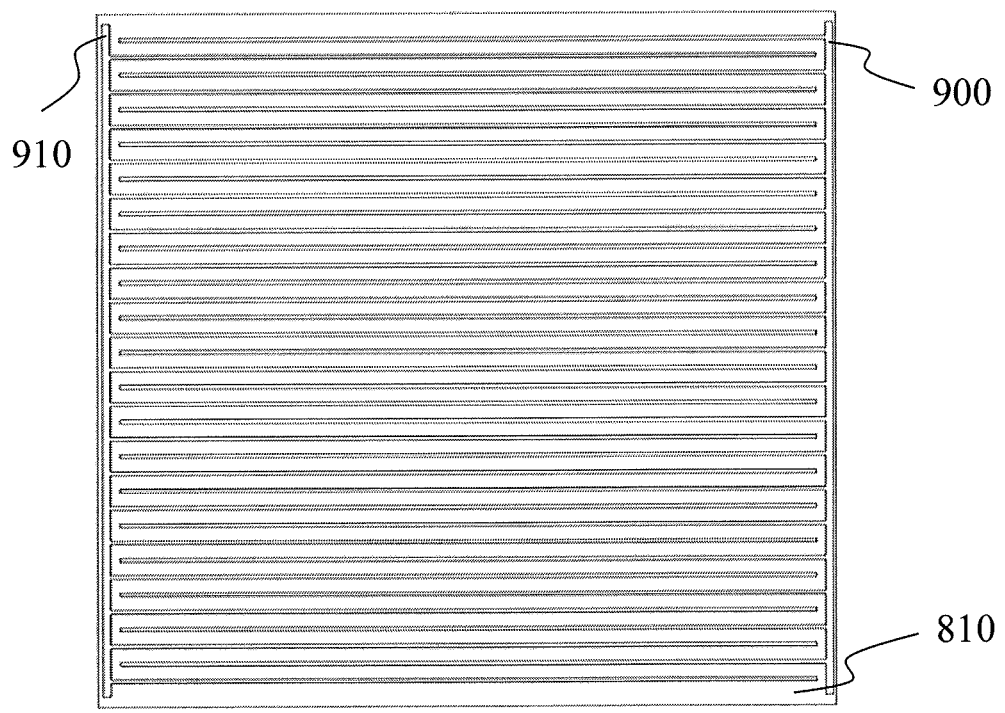
FIG. 9 is a diagrammatic illustration of the rear surface arrangement of electrodes for the interdigitated rear contact solar cell depicted in FIG. 8.

Solar cells on which interdigitated n-type and p-type contacts are formed on the rear surface can minimise shading losses and enable simpler interconnection strategies. FIG. 8 depicts a representative interdigitated solar cell 830 having both polarities of contact made through a rear dielectric layer 810. FIG. 9 shows a rear view of an interdigitated rear contact cell. The metal grids associated with the n-type and p-type contacts are identified by items 900 and 910, respectively. The grids are metal plated through lines which are formed by laser-doping through a rear dielectric layer 810.

Interdigitated rear contact cells can be fabricated using either n-type or p-type wafers, with perhaps the most commercially successful cell design being manufactured by Sunpower Corporation on n-type cells. The cell depicted in FIG. 8 will be described with respect to fabrication on an n-type wafer. The solar cell 830 has a rear p-type emitter 840 passivated by a dielectric layer 810. On the illuminated (metal-free) surface a front-surface field (FSF) 805 is formed by having a lightly-doped phosphorus layer which serves to reduce the effective front surface recombination velocity. An ARC 800 is formed over the illuminated surface. Interdigitated heavily-doped regions are formed for both n-type 835 and p-type 825 contacts on the rear surface by laser-doping. Alternatively, other methods for forming local heavily-doped regions can be used to form these contact regions. Metal is then plated to the heavily-doped regions using FIP as described below resulting in n-type 815 and p-type 820 metal contacts.

Figure 10:
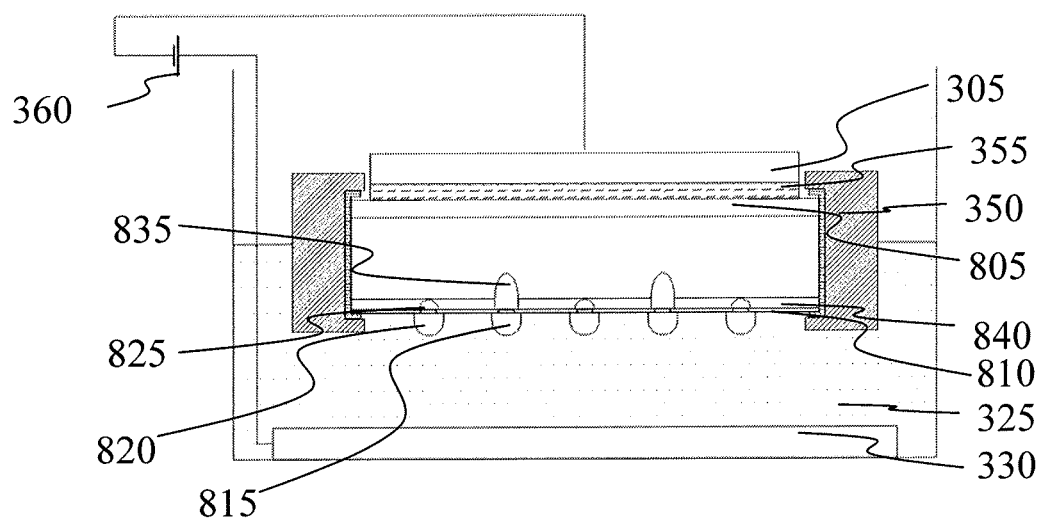
FIG. 10 is a diagrammatic illustration that depicts the plating of metal contacts to an interdigitated rear contact solar cell using an n-type wafer and a field-induced plating apparatus.
Figure 11:
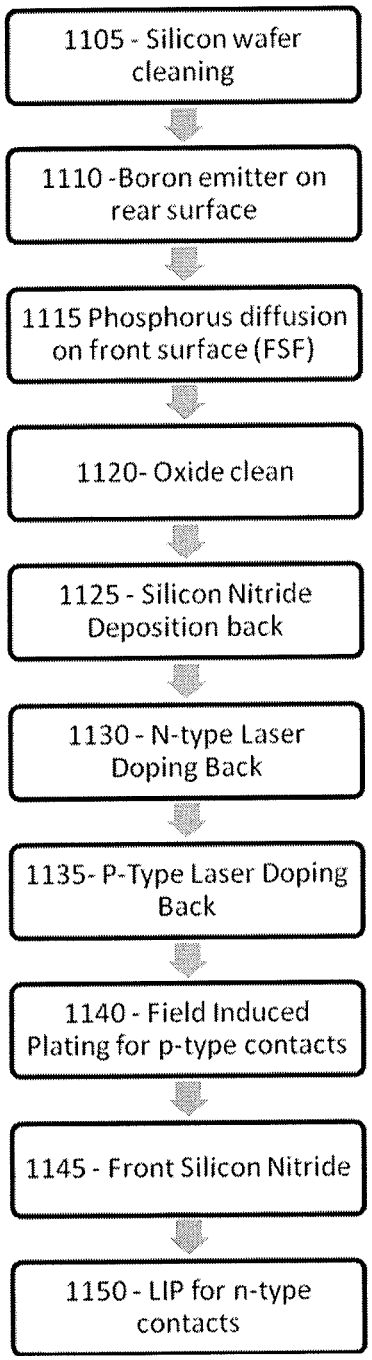
FIG. 11 is a process flow for the fabrication of the device depicted in FIG. 8.

The preferred process flow for metallisation of an n-type cell 830 with a FSF 805 and a rear p-type emitter 840 is shown in FIG. 11. This process, although similar to the previous two arrangements differs in that the FIP process is preferably performed before the application of the ARC 800 to the solar cell 830. The fabrication process proceeds as described for the first arrangement with wafer cleaning in step 1105, following by formation of the rear surface boron-doped emitter and front surface phosphorus doped FSF in steps 1110 and 1115. The diffusion oxide is removed in step 1120 and the rear surface dielectric layer is deposited in step 1125. Preferably this layer comprises one of silicon dioxide, silicon nitride or aluminium oxide, or combinations thereof. Laser doping of the both the n-type an p-type grooves is performed in steps 1130 and 1135, respectively. The heavily-doped p-type regions on the rear surface are then metallised using FIP using the setup shown in FIG. 10.

After immersing the cell briefly in a solution of hydrofluoric acid to remove any native oxide from the front surface of the cell, the cell is inserted in the wafer holder 350 with the laser-doped regions directly facing the bottom surface of the bath and the anode 330. Alternatively a FIP apparatus substantially as shown in FIGS. 3*b* to 3*f* can also be used. The conductive interface material 355 directly contacts the bare silicon front surface of the cell to the cathode 305. When a current-controlled potential is placed over the cell, current flows through the cell and the external circuit because the exposed n-type regions on the immersed surface of the wafer become anodic and oxidise, thus enabling the diode associated with the rear emitter to become forward biased because the potential shunting pathway between the n-type contacts 835 and the electrolyte 325 is blocked. Consequently metal ions can plate to the p-type 825 heavily-doped openings in the dielectric layer 810.

On completion of the FIP process in step 1135, wafers are removed from the wafer holders 350 and an ARC is deposited over the front surface of the cell in step 1145. Metallisation can be then completed in step 1150 where LIP is used to plate to the n-type contacts. In this LIP process the plating apparatus must be varied slightly to provide an electrical contact to the busbar region of the p-type metal grid 910. Preferably, the conductive interface material 355 extends down the side wafer holder 350 to contact the p-type metal grid 910.

There are many different interdigitated rear contact cell designs which can involve different wafer polarity types and the use of floating junctions (FJs) rather than FSFs. With some cells designs where two junctions exist (e.g., an emitter and a FJ) then combinations of LIP and FIP can be used to form metal contacts to both polarity of contact. For example, rear contact cells having an p-type base and a rear n-type emitter can be metallised by performing FIP to metallise the p-type contacts and then LIP to metallise the n-type contacts. In this n-p-n cell design the FJ becomes forward-biased during FIP, and hence will not rectify, however the rear emitter junction will be reverse biased by the applied potential. Consequently, rear p-type contacts can be readily plated using FIP because current does not need pass through the rectifying junction, and the n-type contacts can be plated using FIP with lights present in the base of the plating bath because the rectifying junction successfully separates the light-induced carriers leaving electrons at the surface to participate in the metal reduction reaction.

4. Formation of Anodic Oxide Layers

The FIP process described for the above arrangements can also be used to form high quality anodic oxides. As for the FIP process applied to interdigitated contacts (Arrangement 3), the n-type (anodic) surface is not protected by a dielectric layer. Furthermore in this arrangement, the anodic surface is immersed in the plating electrolyte and the metal plating on the opposing (cathodic) surface is used to drive the formation of an anodic oxide. This variation can be integrated into the plating process for the interdigitated rear contact cell (Arrangement 3) with the anodic oxide layer formed on the surface to be illuminated acting as part of the ARC. The thickness of anodic oxides grown in this manner is limited to 20 nm, which is clearly too thin for an ARC on its own, however the high quality oxide that can be formed in this manner has a low surface state density and can further reduce the front surface recombination velocity of the device. The ARC can be completed by the deposition of a further layer of for example, silicon nitride, to result in optimal antireflection properties for terrestrial applications.

Porous anodic oxides, such as anodic aluminium oxide (AAO) can also be grown on immersed n-type surfaces. In this variation a metal layer such as a thin layer of aluminium can be formed on at least part of the n-type surface by evaporation (thermal or e-beam) or sputtering. This metal layer can then be anodized to form a porous dielectric layer during the FIP process, if the entire wafer is submersed in an acidic medium (e.g., sulphuric acid). The layer is porous because an equilibrium exists between the formation of oxide and its dissolution in an acidic medium. Anodic aluminium oxide layers, formed in situ on silicon wafers, have been shown to enhance the effective minority carrier lifetimes in the silicon wafer.

In the case of an aluminum layer, if all the aluminium in the layer is converted to aluminium oxide, aluminium oxide layers have a high transmittance and thus may find applications in front surface antireflection films for silicon solar cells. Alternatively, if the AAO is located on the rear surface of the cell, then a further layer of aluminium or another light scattering material can be used to fill the pores of the layer in order to form a rear surface reflector.

Preferably, a thin layer of tunnel silicon dioxide, formed by either thermal evaporation or chemical vapour deposition, is formed between the silicon and aluminium to provide a stop-layer for the anodisation process. Electrons can tunnel through this thin layer, which is preferably 2-15 nm thick and more preferably 5-10 nm thick, to ensure continued anodisation of the aluminium, however the layer will act as a barrier for the anodisation process and hence prevent anodisation of the underlying silicon. This barrier layer can also be formed using similarly thin layers of silicon nitride, silicon oxynitride, silicon carbide and aluminium oxide (deposited using either PECVD or atomic layer deposition).

Following from the discussions above, the present disclosure therefore provides an anodisation method (referred to hereinafter as a field-induced anodisation (FIA) method) to form an oxide layer. Generally, in this FIA method, an oxide layer is formed on an exposed surface of a semiconductor device which contains a p-n junction. The exposed surface is immersed in an electrolyte. An electric field is produced in the semiconductor device such that the p-n junction is forward-biased and the exposed surface is anodic, and the exposed surface is electrochemically oxidised to form the oxide layer.

Forward-biasing the p-n junction allows the p-type surface to be made cathodic and the metal layer to be made anodic. However, another type of conductive material layer may be used. Further, an n-type silicon surface of the semiconductor device may be made anodic, with the oxide layer being formed on the silicon surface.

The electrical field may be produced without any direct electrical contact with the semiconductor device. Alternatively contact, e.g. "soft" contact with a non-active surface of the wafer may be made, e.g. to eliminate complications introduced by cathode reaction.

4.1 Formation of Anodic Oxide Layers—Example 1

Example 1 investigates passivation techniques using FIA for silicon solar cells. In Example 1, an anodic aluminium oxide layer is formed over an anodic n-type surface of a forward-biased solar cell placed in an anodizing bath.

Figure 14:
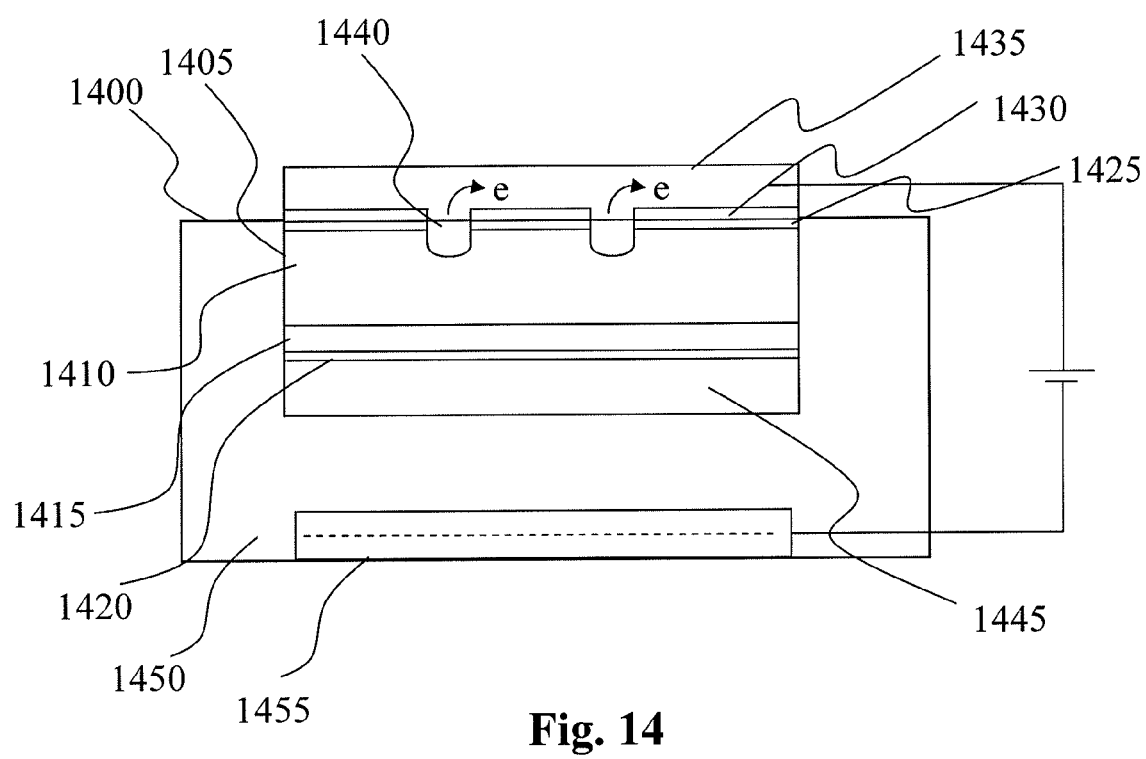
FIG. 14 is a diagrammatic illustration of a solar cell device with a p-n junction in field induced anodisation (FIA) apparatus employed in Example 1.

A schematic illustration of FIA apparatus 1400 used in conjunction with a semiconductor solar cell device 1405 containing a p-n junction, according to Example 1, is provided in FIG. 14. The device 1405 includes a p-type region 1410 and an n-type emitter region 1415. A 10 nm tunnel oxide layer 1420 is provided on the n-type surface. A similar oxide layer 1425 is provided on the p-type surface. To enable photoconductance measurements after FIA, the p-type silicon surface is passivated with a $SiO_2/SiN_x$ layer 1430 and then laser doped in a grid to enable a graphite mat (anode) 1435 to electrically contact the cell via the p-type silicon exposed in laser-doped grooves 1440. Optionally, a metal layer 1445 is located over the oxide on the n-type surface of the wafer fragments. The device 1405 is supported so that only the n-type surface, e.g. the metal-coated n-type surface, contacts electrolyte 1450. A cathode 1455 is suspended in the electrolyte underneath the n-type surface.

Example 1

Experimental

FIA was trialed through preparation and use of a semiconductor device and apparatus generally in accordance with the device and apparatus illustrated in FIG. 14. More particularly, double-side-polished (DSP) boron-doped <100> Cz wafers of resistivity 1-10 Ohm cm, and saw-damaged-etched (SDE) boron-doped <100> Cz wafers of resistivity 1-3 Ohm cm were provided. The thickness of both wafer types was ~180 μm. The wafers were cleaved into ~4 cm×4 cm fragments and phosphorus-diffused using solid sources to a sheet resistance of ~110 Ohm/sq. After phosphosilicate glass removal and rear etching to remove residual phosphorus, a thermal oxide of thickness 10 nm was grown on both surfaces of the wafer. A 75 nm thick layer of SiNx was then deposited on the p-type surface by PECVD using a Roth & Rau AK 400 tool. A grid pattern was laser-doped through a layer of boron source (Filmtronics PBF1) formed on the SiNx surface using a 532 nm laser, a power of ~15 W and a laser speed of 500 mm s$^{-1}$. A 600-700 nm layer of aluminium was then thermally-evaporated over the oxide on the n-type surface of the wafer fragments.

The wafers were placed in the FIA apparatus such that the graphite mat (anode) contacted the exposed silicon in the laser-doped grooves. The aluminium surface was exposed to an electrolyte of 0.5 M $H_2SO_4$ and a nickel electrode (cathode) was suspended in the electrolyte. The cathodic reaction in this arrangement was reduction of hydrogen ions to form $H_2(g)$. Since the size of the wafer fragments used for the experiments was ~4 cm×4 cm, the cathode was simply suspended into the bath. However, e.g., when larger wafers are used, the cathode may be placed under the wafer to ensure a uniform distance from cathode to the n-type surface. Cells were anodized until the current dropped below 0.01 A which typically was achieved in ~2 mins when an anodization voltage of 25 V was used. Cells were annealed in an industrial Centrotherm belt furnace at 400° C. using a belt speed of 4600 mm/min.

The effective lifetime of the anodized samples was monitored using photoconductance measurements before and after laser-doping, after anodization and after annealing. The surface morphology of the formed AAO layer was also examined using scanning electron microscopy (SEM) and compared to surfaces formed using the same electrolyte using a clip-based method. In particular, comparisons were made with a clip-based method as previously reported by Lu et al (P. H. Lu, K. Wang, Z. Lu, A. J. Lennon, and S. R. Wenham, "Anodic aluminium oxide passivation for silicon solar cells," *IEEE J. Photovolt.*, vol. 3, pp 143-151, 2013), where anodic aluminium oxide (AAO) was used to passivate phosphorous-diffused surfaces of p-type silicon wafers. Evaporated aluminium layers were anodized in situ on silicon wafers by clipping the wafer to the positive terminal or a power supply whilst immersed in an anodizing electrolyte. Although this clip-based method was able to result in emitter dark saturation current density values as low as 8 fA cm$^{-2}$ for phosphorus-doped emitters passivated with SiNx/AAO layers on 3-10 Ohm cm Cz saw-damage-etched boron-doped <100> wafers, the contacting mechanism would be difficult to implement in large scale manufacture, especially if wafer thicknesses reduce.

Example 1

Results and Discussion

Figure 15:
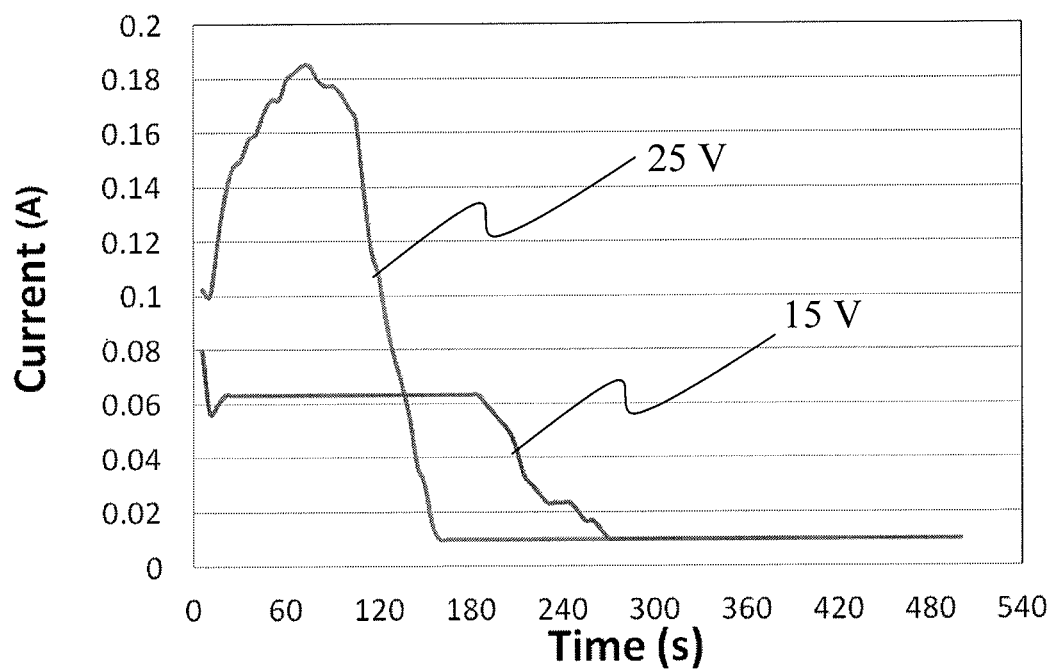
FIG. 15 is a graph of anodisation currents for saw-damaged etched (SDE) wafer fragments anodized at different voltages in Example 1.

FIG. 15 shows the anodisation current measured during anodization of a DSP wafer at 25 V and 15 V. The integrated anodisation current was 19.6±0.9 C and 14.1±1.1 C for the samples, respectively.

Figure 16:
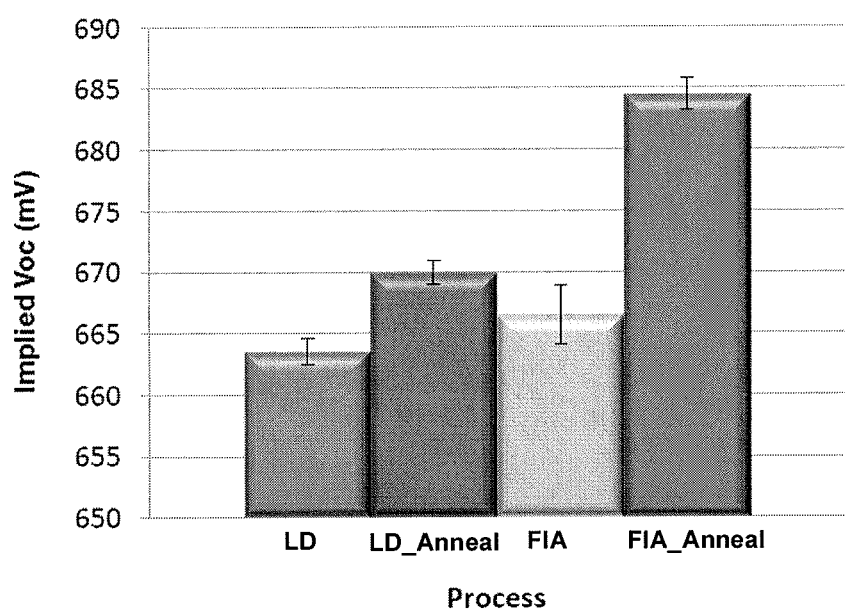
FIG. 16 is a chart of implied voltage ($iV_{OC}$) of double-side-polished (DSP) wafer fragments at different stages of processing in Example 1.

FIG. 16 shows the evolution of effective lifetime, represented as an implied open circuit voltage ($V_{OC}$), measured at different stages of the process when anodisation was performed at 25 V on SDE wafer fragments. In FIG. 16, each bar represents the mean of three measurements and the error bars show the range of measurements. Unlike the anodisation using the clip-based method, the effective lifetime did not increase immediately after anodisation. A subsequent belt furnace anneal was employed and improvements were observed. This initial decrease in lifetime may be due to hole injection damage to the tunnel oxide which can result in increased stored positive charges in the oxide and a higher interface state density. In FIA, holes must tunnel through this oxide, whereas in the clip-based method the current can flow through the aluminium layer.

Annealing in an industrial belt furnace at 400° C. after anodisation resulted in increased effective lifetime of all wafers anodized using FIA. There are a number of possible explanations for this increase. One possible explanation for this increase is the electrochemical process results in water being trapped in the AAO and providing a source of hydrogen to passivate $Si/SiO_2$ interface traps during the belt furnace anneal. However, it is also possible that hydrogen from the SiNx layer (on the p-type surface) may be responsible for the increased effective lifetime.

Figure 17:
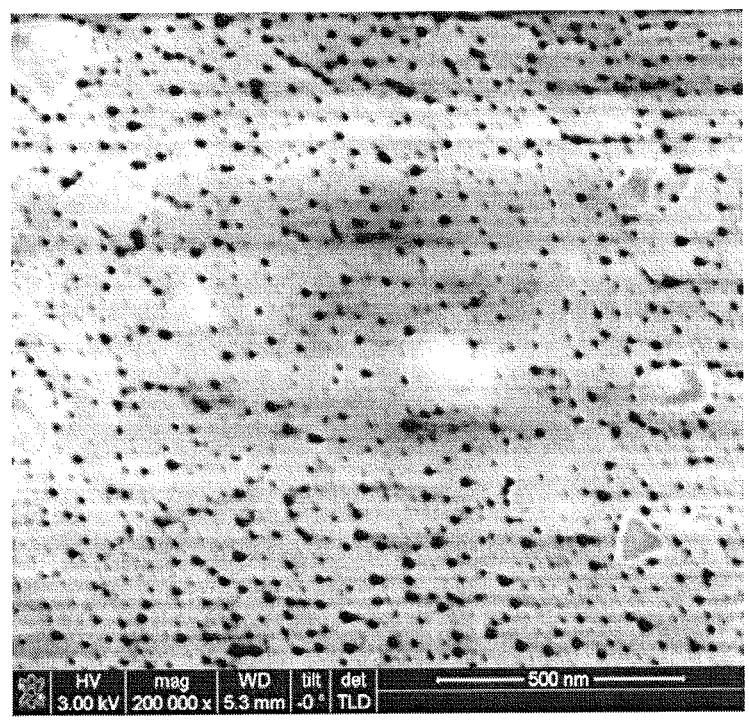
FIG. 17 is a scanning electron microscope image of an AAO layer formed using FIA and a voltage of 25V on a SDE wafer using a voltage of 25V and an electrolyte of 0.5 M $H_2SO_4$ in Example 1.

FIG. 17 is an SEM image of an AAO layer formed using FIA and a voltage of 25 V on a wafer which had been etched in sodium hydroxide to remove damage from the wire sawing. The average pore diameter of ~15 nm is similar to what has been reported using the clip-based method. The tendency for pores to form along the grain boundaries is also observed for the clip based method. Using the latter method, more uniform pore distributions were achieved by annealing the aluminium before anodization.

Example 1

Conclusions

This Example illustrates a new electrochemical low-temperature method for forming passivating layers. Although FIA was demonstrated using anodization of aluminium, the process can be used also to anodize silicon and thus provide an alternative to high-temperature thermal oxides. Example 1 shows that AAO layers formed using FIA are porous like those formed using the clip-based method. Passivation properties of the layers can depend on a subsequent anneal, which may passivate traps at the $Si/SiO_2$ interface which are induced by the tunneling current.

4.2 Formation of Anodic Oxide Layers—Example 2

Example 2 investigates surface requirements for the FIA process that was considered in Example 1. In FIA, although the junction is forward-biased enabling current to be passed through the wafer to make the n-type silicon surface anodic, depletion regions can form at both wafer surfaces resulting in rectifying behaviour that can prevent anodisation even with the application of large bias voltages.

Figure 18:
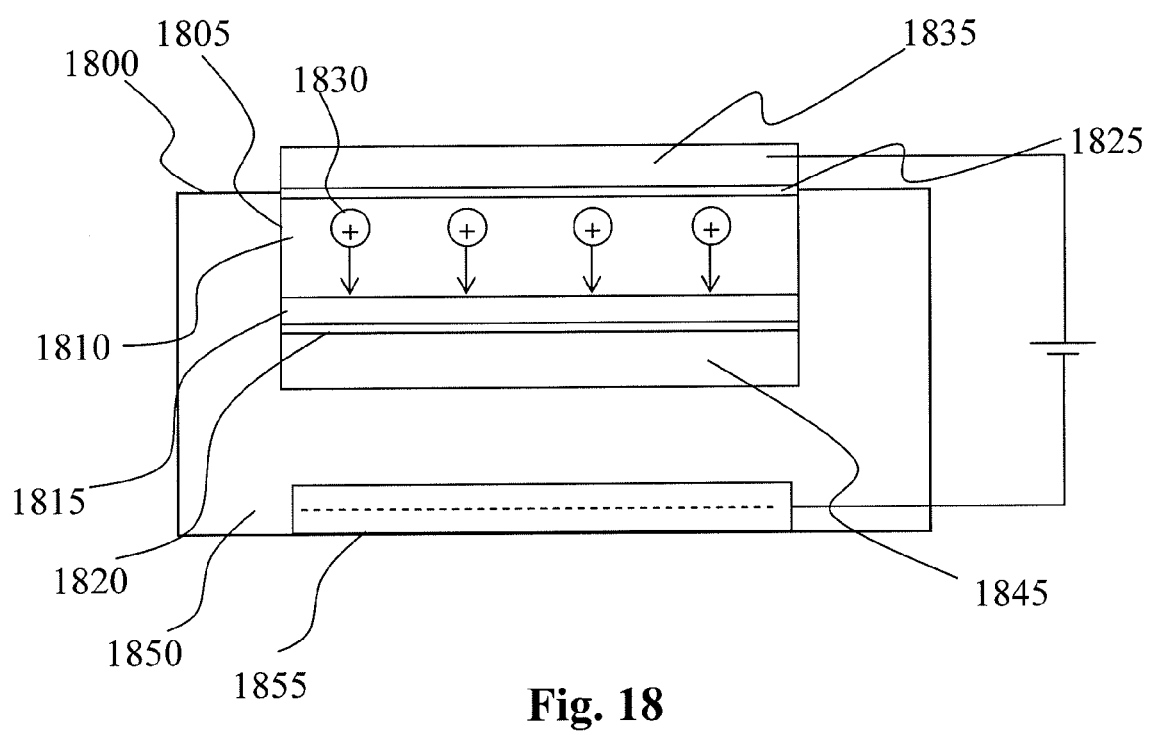
FIG. 18 is a diagrammatic illustration of a solar cell device with a p-n junction in field induced anodisation (FIA) apparatus employed in Example 2.

A schematic illustration of the FIA apparatus 1800 used in conjunction with a semiconductor device 1805 containing a p-n junction, according to Example 2, is provided in FIG. 18. Like Example 1, the semiconductor device 1805 is p-n junction device (e.g., solar cell) that is forward-biased. The device 1805 includes a p-type region 1810 and an n-type emitter region 1815. A 10 nm tunnel oxide layer 1820 is provided on the n-type surface. A similar oxide layer 1825 is provided to protect the p-type surface. The applied potential, V, is applied using a graphite electrode 1835 to the p-type surface of the device enabling holes 1830 to be injected into the n-type emitter 1815 where they can be filled with electrons generated by the oxidation of either the silicon (to form an anodic SiO2 layer) or an aluminium layer 1845 (to form an anodic aluminium oxide (AAO) layer). To complete the circuit hydrogen ion reduction occurs at a cathode 1855 immersed in electrolyte 1850.

In FIA very high currents are possible because the p-n junction is forward biased. Theoretically, currents of a p-n junction device should be able to exceed those possible in a p-type wafer due to the additional diffusion currents that result with an applied bias. However, this is a very simplistic view of the process. First, the potentially increased current enabled by the diffusion currents cannot be realised due to the series resistance associated with the electrochemical circuit. Additionally depletion regions can form at both the p-type and n-type surfaces, if these surfaces are not sufficiently heavily-doped.

Figure 19:
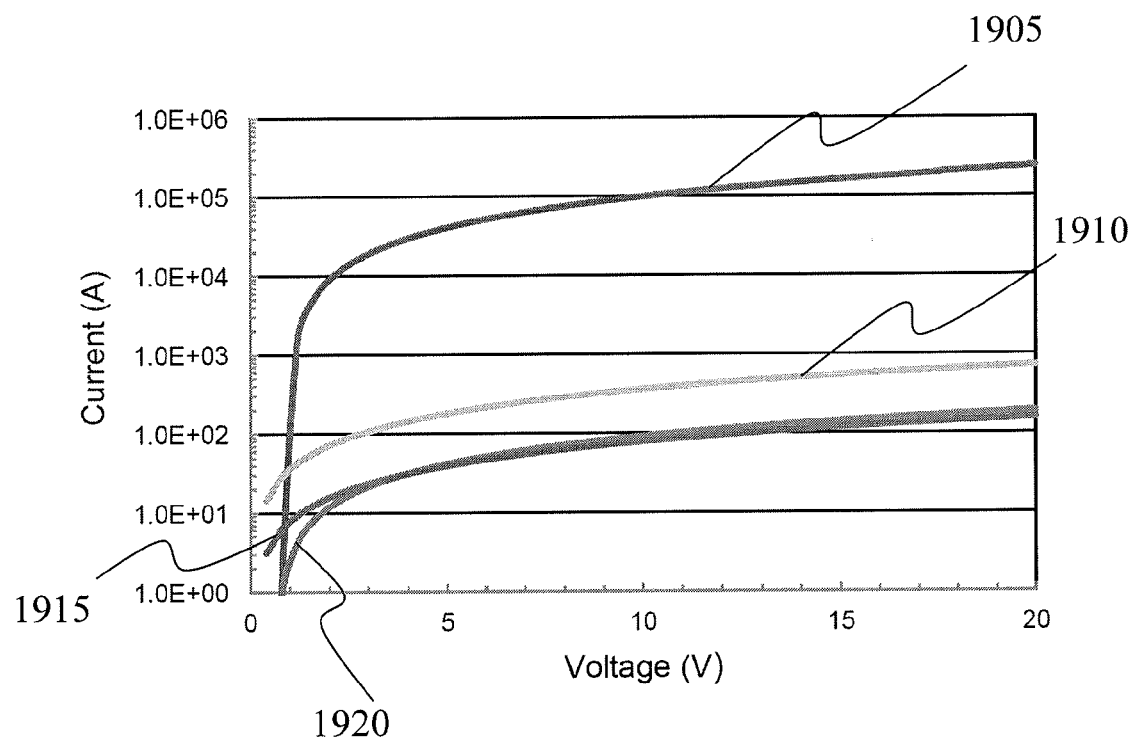
FIG. 19 is a graph of PC1D-simulated current-voltage data for a forward-biased p-n junction compared to a 1 Ohm $cm^2$ wafer in Example 2.

FIG. 19 shows the current-voltage curves of a p-type 1 Ohm cm wafer simulated using PC1D with 1905 and without 1910 a p-n junction. The same p-n junction 1915 and p-type wafer 1920 were also simulated with front and rear surface recombination velocities of 2000 cm s-1 and series resistance of 0.05 Ohm cm². In the absence of significant series resistance and surface recombination much higher currents are predicted with a p-n junction compared to an undiffused wafer due to the presence of diffusion currents. However, in practice these high anodisation currents cannot be achieved due to inevitable surface recombination and series resistance due to current tunneling through the growing oxide and resistances due to electrode contact and the electrolyte.

Figure 20:
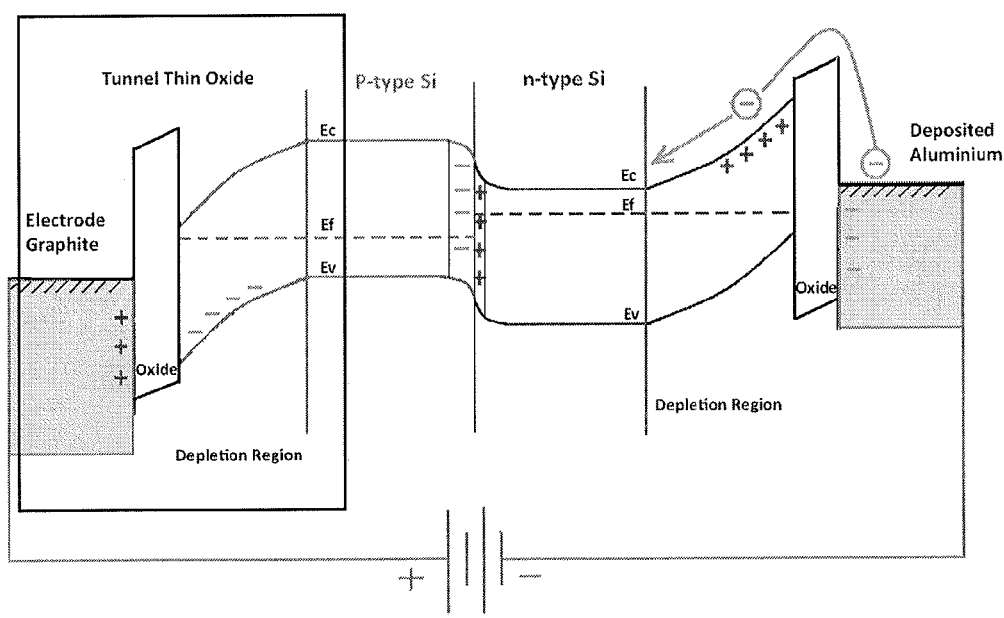
FIG. 20 is an energy band diagram showing how depletion regions can form at the wafer surfaces during FIA on the n-type surface of the cell device in Example 2.

Schottky diodes can form at both surfaces of forward-biased diffused wafers as illustrated in FIG. 20 if the surfaces are not sufficiently heavily-doped. If not addressed, these diodes will rectify and anodisation cannot occur. Application of an anodic potential to the p-type surface can reverse bias the Schottky diodes at both surfaces causing the depletion regions to extend further into the wafer and rectify current flow through the wafer.

The problem at the p-type surface can be addressed by making electrical contact through the anode to heavily-doped p+ regions on that surface. In Example 1, this was achieved by laser-doping regions in the p-type surface. However, this is undesirable as laser damage is introduced, which can increase the recombination losses at the wafer's surfaces. In Example 2, light is used to generate a photo-current across this depletion region (i.e., a photodiode). Similar rectification can occur on the n-type surface if it is not sufficiently heavily-doped. Therefore, current flow can be achieved by doping the wafer surfaces (see Example 1) and using illumination (Example 2) to generate a photocurrent in the depletion region. The latter approach is particularly advantageous because it means that FIA can be performed while maintaining better integrity of the p-type surface passivation.

Example 2

Experimental

Double-side polished 1-3 Ohm cm boron-doped Czochralski (Cz) wafer fragments of ~4 cm×4 cm were diffused back-to-back using solid sources to emitter sheet resistances of ~60, 100 and 145 Ohm/sq. The phosphosilicate glass was removed from the emitter surfaces and the rear surfaces were etched in Trilogy etch whilst the front wafer surface was maintained dry. A ~10 nm thermal oxide was then grown on both surfaces using dry oxidation at 980° C.

Figure 21:
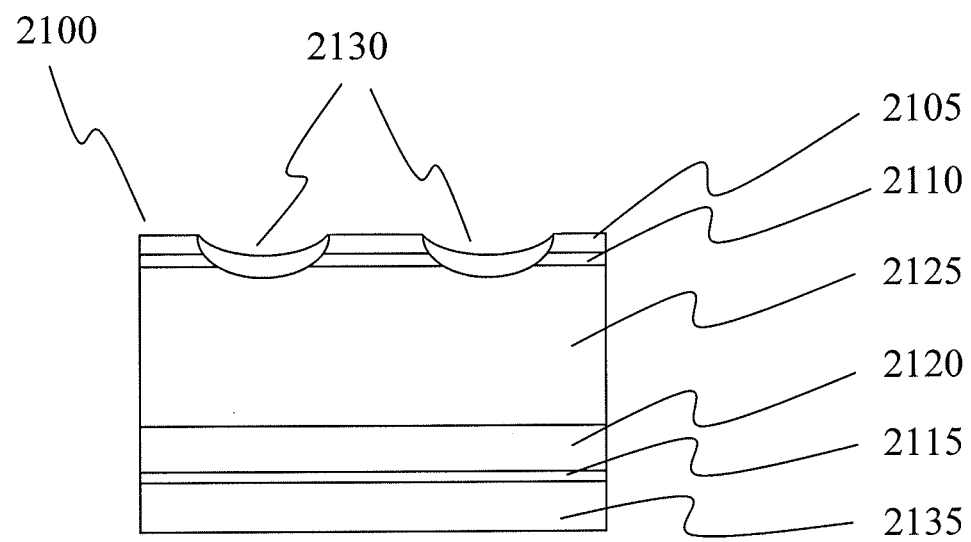
FIG. 21 is a substrate used for FIA experiments to determine the effect of n-type emitter sheet resistance on the FIA process in Example 2.

For experiments designed to determine the effect of the diffused emitter sheet resistance, 75 nm SiNx was deposited on the p-type surface using plasma-enhanced chemical vapour deposition (PECVD) using an Roth & Rau AK400. Lines spaced 1 mm apart were then laser-doped through a boron-spin-on source (PBF1 from Filmtronics) using a laser speed of 0.5 m/s and a laser power of 14.8 W. A soft graphite electrode contacts the silicon through the laser-doped openings to achieve electrical contact to the wafer in the presence of the SiNx layer. A layer of aluminium of thickness 600 nm was thermally-evaporated from 5N purity aluminium wire on the thin oxide covering the n-type emitter. This process results in substrates 2100 as shown schematically in FIG. 21, the substrates having 75 nm SiNx layer 2105, 10 nm $SiO_2$ layers 2110, 2115, n-type region 2120, p-type region 2125, laser dope/scribe openings 2130, and 600 nm aluminium layer 2135.

Anodisation was performed in 0.5 M $H_2SO_4$ (electronic grade from J. T. Baker) using an arrangement similar to that shown in FIG. 18. For all experiments a bias voltage of 25 V (with respect to the cathode) was applied to the graphite electrode. The anodisation current was monitored through the FIA process. As the thickness of the anodic oxide increased, the current reduced due to the resistance of current tunneling through the oxide. Anodisation was considered to be complete when the current reduced to 2 mA which was the lowest current that could be achieved with the power supply used. Wafers were then rinsed under deionised water and dried with a nitrogen gun to remove water vapour. After FIA of aluminium, wafers were annealed in a belt furnace in air where they experienced the peak temperature of 400° C. for less than 1 min.

Silicon anodisation was performed to determine the role of illumination on the FIA process. In these experiments the thin oxide on the n-type surface was etched by immersion in HF before FIA was performed. To enable both illumination and an applied bias voltage to be applied from the p-type surface, a patterned graphite anode was used. The thickness of the final $SiO_2$ was determined by the anodisation potential and the current reduced as the resistance due to the carriers tunneling through the growing oxide layer increased. This process differs from anodisation of aluminium, which is discussed above, where the process continues until essentially all the aluminium is anodised. Measurements of integrated current over time can be used to estimate the total charge delivered to the wafer during FIA and therefore to assess the completeness of the anodisation of aluminium from a knowledge of Faraday's Law. Similarly, estimates of the efficiency of silicon anodisation can be made from measurements of the charge consumed by the process and the thickness of the oxide layer.

The effective minority carrier lifetime was measured to assess the passivation provided by the anodic oxide. Measurements were made using a Sinton WCT-100 bridge (Sinton Instruments) using the generalised method and the implied open circuit voltage, $iV_{oc}$, at 1-sun excitation was calculated using the relationship:

$$iV_{oc} = \frac{kT}{q}\ln\left(\frac{N_A \Delta n}{n_i^2}\right),$$

where k, T, and q represent Boltzmann's constant, the absolute temperature and the electronic charge, respectively. The carrier injection level Δn was calculated from the sheet photoconductance under 1-sun irradiation, $N_A$ represents the boron dopant density of the wafers used, and $n_i$ is the intrinsic carrier concentration of silicon ($8.6 \times 10^9$ cm$^{-3}$ at 25° C.). The $iV_{oc}$ was used as a measure of the passivation quality provided by the anodic oxide.

Example 2

Results and Discussion

The starting current, integrated charge and anodisation time were measured for 3 wafers (per group) having n-type emitter sheet resistances of 47-64 Ohm/sq, 82-127 Ohm/sq and 137-158 Ohm/sq. The results are provided in Table 1, where starting and maximum anodisation currents and anodisation time for wafers anodised using FIA with different emitter sheet resistances are provided. The results are presented as the mean values, with the range of values measured for 3 independently anodised wafers being listed in parentheses.

TABLE 1

|  | 47-64 Ohm/sq Emitter | 82-127 Ohm/sq Emitter | 1 Ohm/sq Emitter |
|---|---|---|---|
| Starting Current (mA) | 66 (65-67) | 62 (54-70) | 55 (43-63) |
| Maximum Current (mA) | 150 (135-165) | 130 (122-141) | 92 (81-99) |
| Anodisation Time | 1 min 57 s (1 min 50 s-2 min 5 s) | 3 min 33 s (3 min 15 s-4 min 0 s) | 4 min 42 s (4 min 15 s-5 min 0 s) |

The anodisation profiles varied considerably within each group due to both variations in the emitter sheet resistance and variations in contact resistance between the graphite anode and the wafer. However, the more heavily-doped emitters all experienced higher initial and maximum anodisation currents and anodised more quickly than the more lightly-doped emitters. Furthermore, the contacting of the graphite anode was more sensitive for the lightly-doped emitters and in some cases the electrode needed to be re-adjusted to ensure a FIA current could flow. The lower anodisation rate for the more lightly-doped emitters was likely due to the increased series resistance across the n-type interface which would have reduced the effective potential across the aluminium layer.

Figure 22:
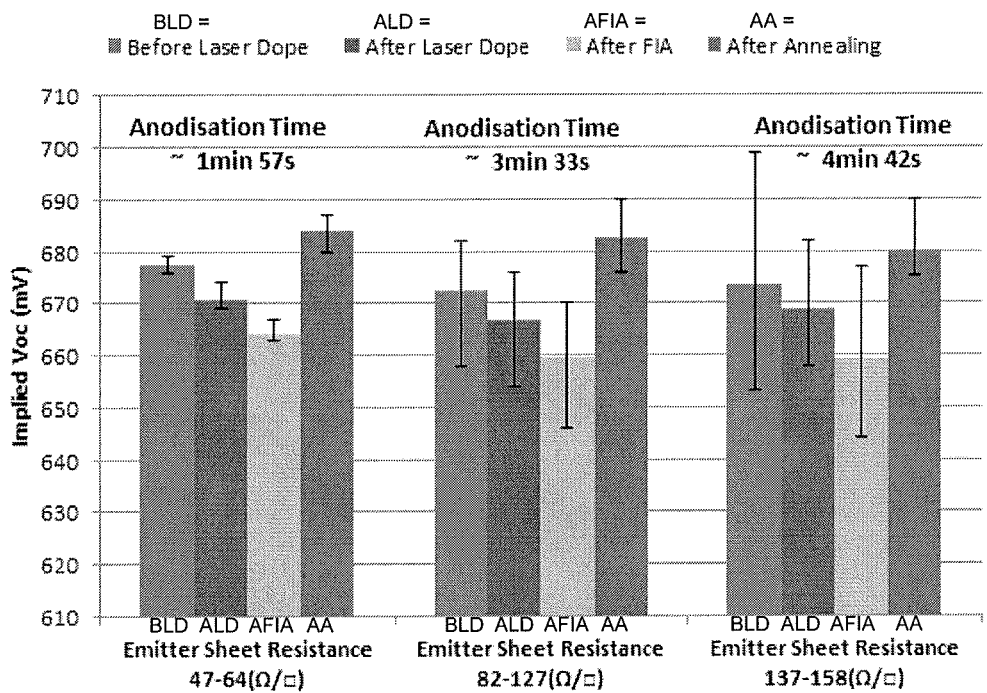
FIG. 22 is a chart of implied voltage ($iV_{OC}$) estimated for wafers with different emitter doping levels at different stages of processing in Example 2.

The effective lifetime was measured for the wafers before and after laser-doping, after anodisation and after annealing, and the results are provided in FIG. 22. In FIG. 22, error bars represent the ranges of values measured for the 3 wafers that were independently anodised. For each group the laser doping and FIA processes each resulted in a decrease in the $iV_{oc}$; however, after annealing at 400° C. in the belt furnace the $iV_{oc}$ increased to an average value that was ≥680 mV (effective lifetime of 220≥μs) for all groups. This suggested that although anodisation was slower for the wafers with lightly-doped emitters, the final lifetime result was not impacted.

There was significantly greater variation in the $iV_{oc}$ values for the lightly-doped emitter group. This variation was evident in the pre laser-doping measurements and persisted through the processing. A higher initial $iV_{oc}$ would have been expected for this group due to a reduced emitter saturation current density; however, the large degree of variation may have been due to a non-uniform diffusion process. This variation persisted through the processing, though was reduced after the belt furnace annealing.

The results provided in FIG. 22 suggest that the FIA process can result in very consistent effective lifetimes given considerable variation in emitter doping and the anodisation rate. Although more heavily-doped emitters appear to result in faster anodisation, there appears to be no impact in terms of final passivation quality if more lightly-doped emitters are used.

To confirm the usefulness of a heavily-doped p-type surface to ensure a through-wafer current flow in FIA, instead of boron laser-doping wafers as described in the experimental section, lines were simply scribed through the SiNx layer using the same line spacing as used for the boron laser-doping process. Table 2 shows that without the boron laser-doping, anodisation was very slow due to the increased resistance provided by the undoped contact regions. (Table 2 provides starting and maximum anodisation current and anodisation time for wafers anodised using FIA with different p-type contacting schemed under the graphite electrode. The results are presented as the mean values, with the range of values measured for 3 independently anodised wafers being listed in parentheses.) However, even though the initial iVoc values for the laser-scribed wafers were higher than those of the laser-doped wafers, they were significantly decreased by the laser-scribing process which offers no minority carrier shielding and consequently increased recombination at the exposed silicon regions.

TABLE 2

|  | Boron Laser-Doping | Laser-Scribing |
|---|---|---|
| Starting Current (mA) | 62 (54-70) | 13 (11-14) |
| Maximum Current (mA) | 130 (122-141) | 13 (13-14) |
| Anodisation Time | 3 min 33 s (3 min 15 s-4 min 0 s) | 34 min 50 s (32 min 40 s-38 min 40 s) |

Figure 23:
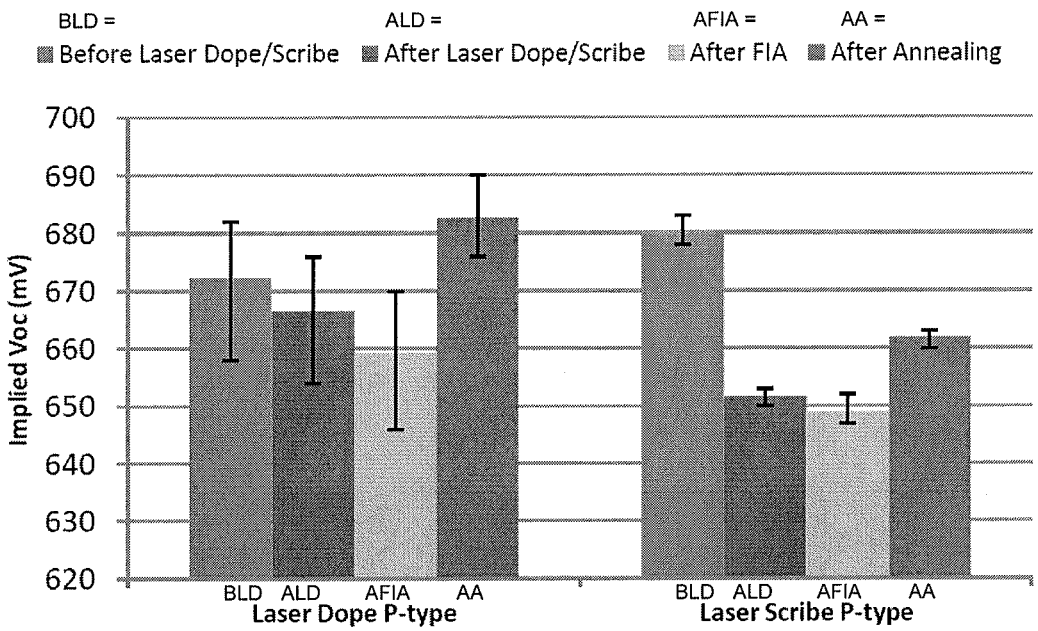
FIG. 23 is a chart of implied voltage ($iV_{OC}$) estimated for wafers with different p-type contact regions at different stages of processing in Example 2.

Although the effective lifetime was increased by ~57% and ~42% for the laser-doped and laser-scribed wafers, respectively, after FIA and annealing, the large reduction in effective lifetime after laser-scribing was not able to be totally recovered for the latter group and the final iVoc values after annealing only reached 662 mV compared to the 683 mV for the laser-doped group. In this regard, reference should be made to FIG. 23, which shows iVoc values estimated for the wafers with different p-type contact regions at different stages of processing. The error bars represent the range of values measured for 3 wafers that were independently anodized.

Figure 24:
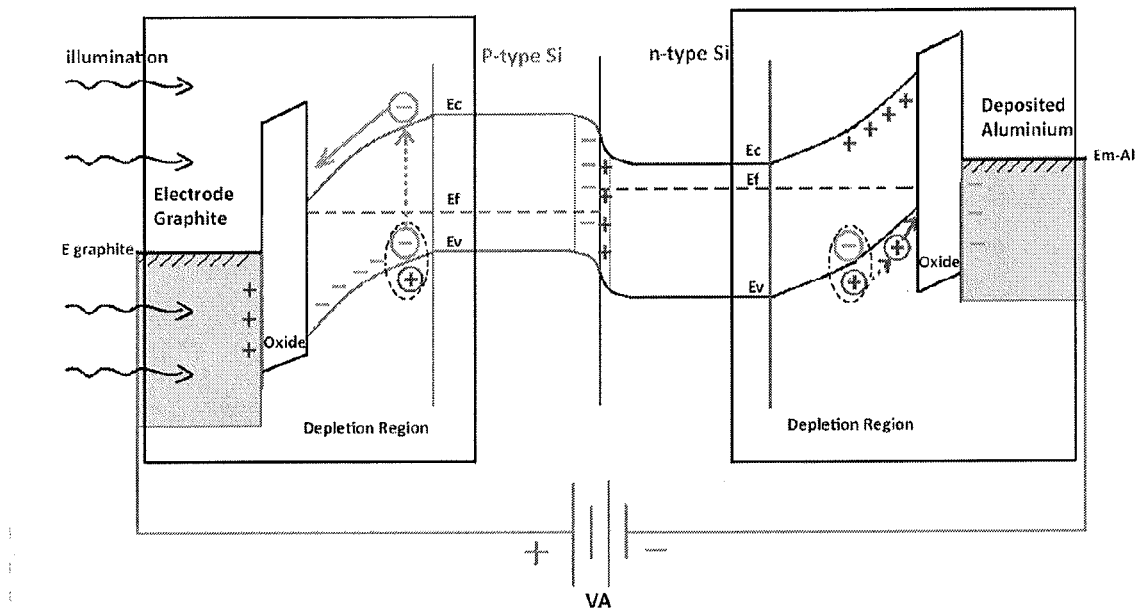
FIG. 24 is an energy band diagram showing how illumination (from a p-type surface) can achieve a photocurrent in the depletion regions at the wafer surfaces to enable an anodisation current to flow through the wafer.

Although laser-doping can be used to address Schottky diodes that form at the p-type surface, it is undesirable to have to create these regions as they introduce unnecessary laser damage. Furthermore they most likely contribute to non-uniform anodisation because the current will flow directly through the wafer from the contact regions (i.e., not uniformly across the wafer as has been observed for light-induced anodisation). Illumination can be used to generate a current across depletion regions and therefore provides an alternative to laser-doping to achieve a current flow through the wafer. With an illuminated Schottky diode, also called a photo diode, an increased reverse bias results in an increase in the width of the depletion region but also an increase in the electric field magnitude. Consequently any carriers that are generated in the depletion region are swept out either into the bulk of the wafer or to the electrode, thus enabling an anodisation current to flow through the wafer as shown in FIG. 24. If the p-type surface of the wafer is illuminated a significant photocurrent is generated within the depletion region at the p-type surface, however a much smaller fraction of the light can also be absorbed at the n-type surface therefore alleviating Schottky diode problems at that surface as well. The wavelength of light should also be able to be tuned to generate a greater photocurrent at one surface than the other. It is important to note that with this approach the current direction through the wafer is defined by the applied bias (i.e., it is still a field-induced current and the p-n junction remains forward biased).

Figure 25:
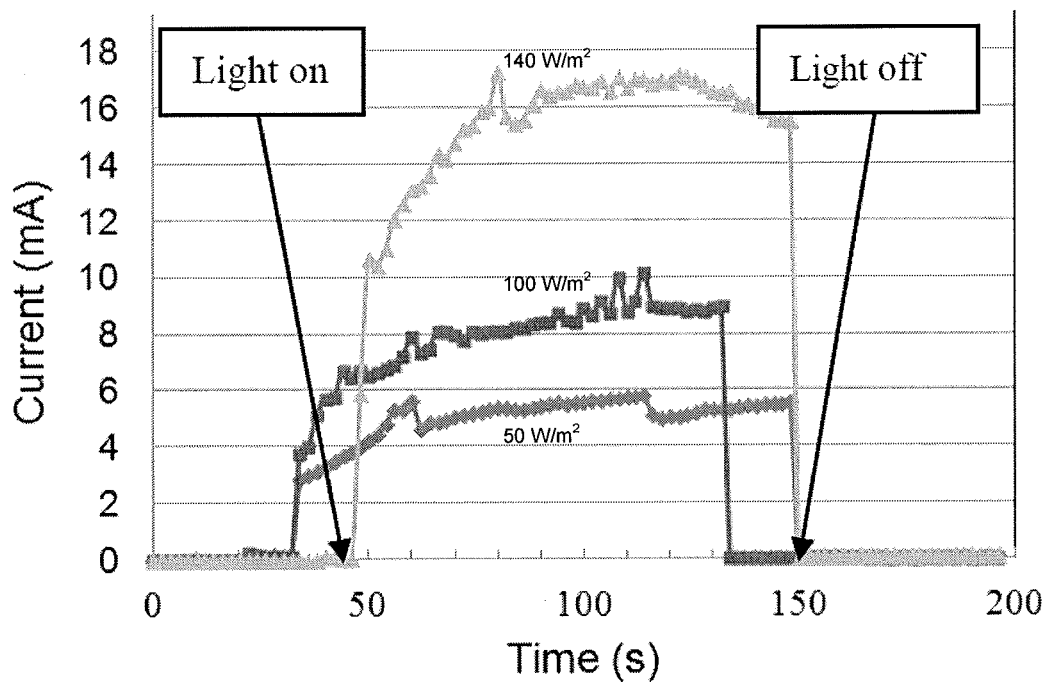
FIG. 25 is a graph of anodisation current as a function of time during FIA for silicon anodisation p-type wafers in Example 2.

The use of illumination to achieve FIA of silicon was demonstrated by illuminating the wafers through a patterned graphite electrode placed in contact with the 10 nm $SiO_2$ layer on the p-type surface. Anodisation was performed in 0.5 M $H_2SO_4$ using a voltage of 25 V and the anodisation current was measured as a function of time and light intensity. FIG. 25 shows the change in anodisation current as a function of time during the process for light intensities of 50 $W/m^2$, 100 $W/m^2$, and 140 $W/m^2$. The experiments used a compact fluorescent light source and the illumination intensity was varied by varying the distance between the light source and the p-type wafer surface. An anodisation current was only observed when the light was turned on, and the magnitude of the current increased with light intensity as shown in FIG. 25. The semiconductor device was illuminated from above using the patterned graphite electrode; however, illumination can also be provided from below the cell (i.e. through the electrolyte). The use of a photocurrent to achieve current flow across Schottky diode is also beneficial in terms of anodisation uniformity as it enables the current flow to be uniform across the wafer.

Example 2

Conclusions

FIA can offer a low-cost method for forming passivation layers for silicon wafers, which may prove critical for future silicon PV manufacturing cost reduction.

In FIA where the junction is forward-biased to allow anodisation of the n-type surface, Schottky diodes can potentially form at both the n-type and p-type wafer surfaces, with the depletion regions of these diodes being increased in width by the application of the anodic potential to the p-type surface.

Example 2 shows how both increased n-type emitter doping and the p-type surface doping can increase the anodisation rate due to reducing resistive losses. Although anodisation proceeds more slowly with reduced emitter doping, the final effective lifetime does not appear to be impacted with similar final iVoc values after annealing being recorded for wafers with emitter sheet resistances ranging from 55 to ~150 Ohm/sq. Reduced doping at the p-type surface by using laser scribing rather than laser-doping did impact final device performance largely because the recombination losses that were incurred at the laser-scribed regions, where there is no minority carrier shielding from the surface, cannot be recovered in the subsequent anodisation and annealing process.

A way of addressing the problems associated with Schottky diodes in FIA uses illumination to generate a photocurrent in the depletion regions at the silicon surfaces. With this approach the p-n junction remains forward-biased; however, carriers that are generated in the depletion region(s) are swept out of the region(s) by the electric field generated by the applied bias. This process, which is more aptly described as light-assisted FIA, may be able to be used in conjunction with light-induced anodisation (LIA) to enable anodisation of either silicon or aluminium for future low-cost silicon solar cell passivation.

5. Formation of Metal Capping Layers

Field induced plating can also be used to form metal capping layers that can be used, for example, to enable contact free LIP. Many LIP systems that have been developed for the metallisation of silicon solar cells which have a screen-printed aluminium rear electrode, require the use of bias-assisted LIP in order to minimise the amount of aluminium that is corroded from the rear surface. Some of the aluminium that oxidizes dissolves in the plating bath and this limits the longevity of the plating solution and thus increases the manufacturing cost. Bias-assisted LIP for these cells requires that physical low-resistance contact is made to the porous aluminium layer that oxidizes readily on hydration.

Another option is to perform FIP to form a sacrificial metal capping layer over the rear aluminium electrode and then to use the formed layer as the anode in contact free LIP. The metal capping layer can be formed from a metal that is required to plate exposed n-type regions on the front surface of the cell. Eliminating the need to contact the cell during LIP greatly simplifies the process and hence potential manufacturing costs.

For example, in the setup of FIG. 3a, if the aluminum layer 115 was deposited onto the opposite surface over the top of silicon nitride layer 130, then the application of the FIP process would lead to the plating of positive metal ions from the electrolyte 325 onto the exposed surface of the aluminium layer. Subsequent immersion of the wafer entirely within the electrolyte and exposure to light (and in the absence of power supply 360) would drive the LIP process so as to transfer the plated metal from the p-type contact to the n-type contact. This would take place without corrosion of the aluminium layer since it is protected from the electrolyte by the plated metal. An example implementation for the nickel/copper metallization is when FIP is initially used to plate copper onto the aluminium layer followed by a thin layer of nickel. The use of the LIP process then initially transfers this nickel to the exposed n-type surfaces of the wafer followed by a transition layer comprising both nickel and copper and eventually a substantially thicker layer comprising almost completely copper that was originally plated onto the aluminium surface.

It will be appreciated that a number of different methods of forming front and rear metal contacts have been disclosed herein. Aspects of these different methods may be interchanged, for example the roller transport mechanism shown in some of the FIG. 3 embodiments might also be used in the FIGS. 11 & 12 embodiments.

The invention claimed is:

1. A method of forming an oxide layer on an exposed surface of a semiconductor device which contains a p-n junction, the method comprising: (i) immersing the exposed surface of the semiconductor device in an electrolyte; (ii) producing an electric field in the semiconductor device while the exposed surface of the semiconductor device is immersed in the electrolyte, such that the p-n junction is forward-biased and the exposed surface is anodic; and (iii) electrochemically oxidising the exposed surface of the semiconductor device while the exposed surface of the semiconductor device is immersed in the electrolyte and the p-n junction is forward biased, to form an oxide layer.

2. The method of claim 1 wherein the exposed surface comprises a surface on the n-type semiconductor region of the semiconductor device.

3. The method of claim 2 wherein the exposed surface is silicon.

4. The method of claim 1 wherein the semiconductor device comprises a metal layer formed over the n-type region of the semiconductor device and the exposed surface comprises a surface of the metal layer.

5. The method of claim 4 wherein the semiconductor device comprises a tunnel oxide layer between the n-type semiconductor layer and the metal layer.

6. The method of claim 5 wherein the tunnel oxide layer has a thickness between 2-15 nm.

7. The method of claim 5 wherein the tunnel oxide layer has a thickness between 5-10 nm.

8. The method of claim 4 wherein the metal layer comprises one of aluminium, titanium, zinc, magnesium, niobium, and tantalum and alloys of these metals.

9. The method of claim 4 wherein the exposed surface is doped to a level that ensures ohmic electrical contact between the surface and the electrolyte.

10. The method of claim 1 wherein the electrolyte is acidic.

11. The method of claim 10 wherein the electrolyte comprises one of sulphuric acid, nitric acid, boric acid, oxalic acid, phosphoric acid, and combinations of these acids.

12. The method of claim 1 wherein the formed oxide layer is porous.

13. The method of claim 1 wherein the electric field is produced by applying a positive potential to a p-type semiconductor surface of the semiconductor device.

14. The method of claim 13 wherein the positive potential is applied using a power source operating under constant voltage or constant current mode.

15. The method of claim 13 wherein the electric field is produced by an electrode placed in contact with either one of the p-type semiconductor surface and a thin interfacial oxide layer formed on the p-type semiconductor surface.

16. The method of claim 13 wherein the positive potential is applied to the p-type semiconductor surface through a plurality of openings in a dielectric layer formed on the p-type surface.

17. The method of claim 16 wherein the openings in the dielectric layers are formed by one of laser processing and chemical etching.

18. The method of claim 13 wherein a rate of formation of the oxide layer is controlled by the magnitude of the applied positive potential.

19. The method of claim 1 wherein the semiconductor device comprises a dopant concentration such that a Schottky diode forms at a surface of the device and the method comprises illuminating the device to generate a photocurrent at the surface where the Schottky diode forms.

20. The method of claim 19 wherein a rate of formation of the oxide layer is controlled by the illumination intensity.

21. The method of claim 1 wherein the exposed surface is doped to a level that ensures ohmic electrical contact between the surface and the electrolyte.

22. The method of claim 1 wherein the semiconductor device comprises a material layer formed over the n-type region of the semiconductor device and the exposed surface comprises a surface of the material layer.

23. The method of claim 22, wherein the material layer is an anodisable material layer.

24. The method of claim 22 wherein the material layer is an anodisable material layer and is formed over an intermediate material layer that is located over the n-type region of the semiconductor device.

* * * * *